United States Patent [19]
Ueno et al.

[11] Patent Number: 5,978,294
[45] Date of Patent: Nov. 2, 1999

[54] MEMORY CELL EVALUATION SEMICONDUCTOR DEVICE, METHOD OF FABRICATING THE SAME AND MEMORY CELL EVALUATION METHOD

[75] Inventors: Shuichi Ueno; Tomohiro Yamashita; Hidekazu Oda; Shigeki Komori, all of Tokyo, Japan

[73] Assignee: Mitsubishi Denki Kabushiki Kaisha, Tokyo, Japan

[21] Appl. No.: 09/112,506

[22] Filed: Jul. 9, 1998

[30] Foreign Application Priority Data

Jan. 21, 1998 [JP] Japan .................................. 10-009591

[51] Int. Cl.⁶ .............................. G11C 7/02; G11C 11/24
[52] U.S. Cl. ............................................. 365/210; 365/149
[58] Field of Search ...................................... 365/210, 149

[56] References Cited

U.S. PATENT DOCUMENTS

| | | | |
|---|---|---|---|
| 4,231,109 | 10/1980 | Ono et al. ................................ | 365/210 |
| 5,793,671 | 8/1998 | Selcuk .................................... | 365/210 |
| 5,822,240 | 10/1998 | Yoo ....................................... | 365/149 |

FOREIGN PATENT DOCUMENTS 8-96597   4/1996   Japan .

*Primary Examiner*—Trong Phan
*Attorney, Agent, or Firm*—Oblon, Spivak, McClelland, Maier & Neustadt, P.C.

[57] ABSTRACT

A dummy cell part <31> includes a capacitor <311> having a first end which is connected to one of a plurality of pads <2> and a P-N junction element <312> having a first end which is connected to one of the plurality of pads <2> and a second end which is connected to one of the plurality of pads <2>. A sense part <32> is connected to a second end of the capacitor <311>, for sensing a potential on the second end of the capacitor <311> and outputting the result of sensing to one of the plurality of pads <2>. Thus, a memory cell evaluation semiconductor device which can evaluate a single memory cell, a method of fabricating the same and a memory cell evaluation method are obtained.

18 Claims, 40 Drawing Sheets

F I G. 1 3
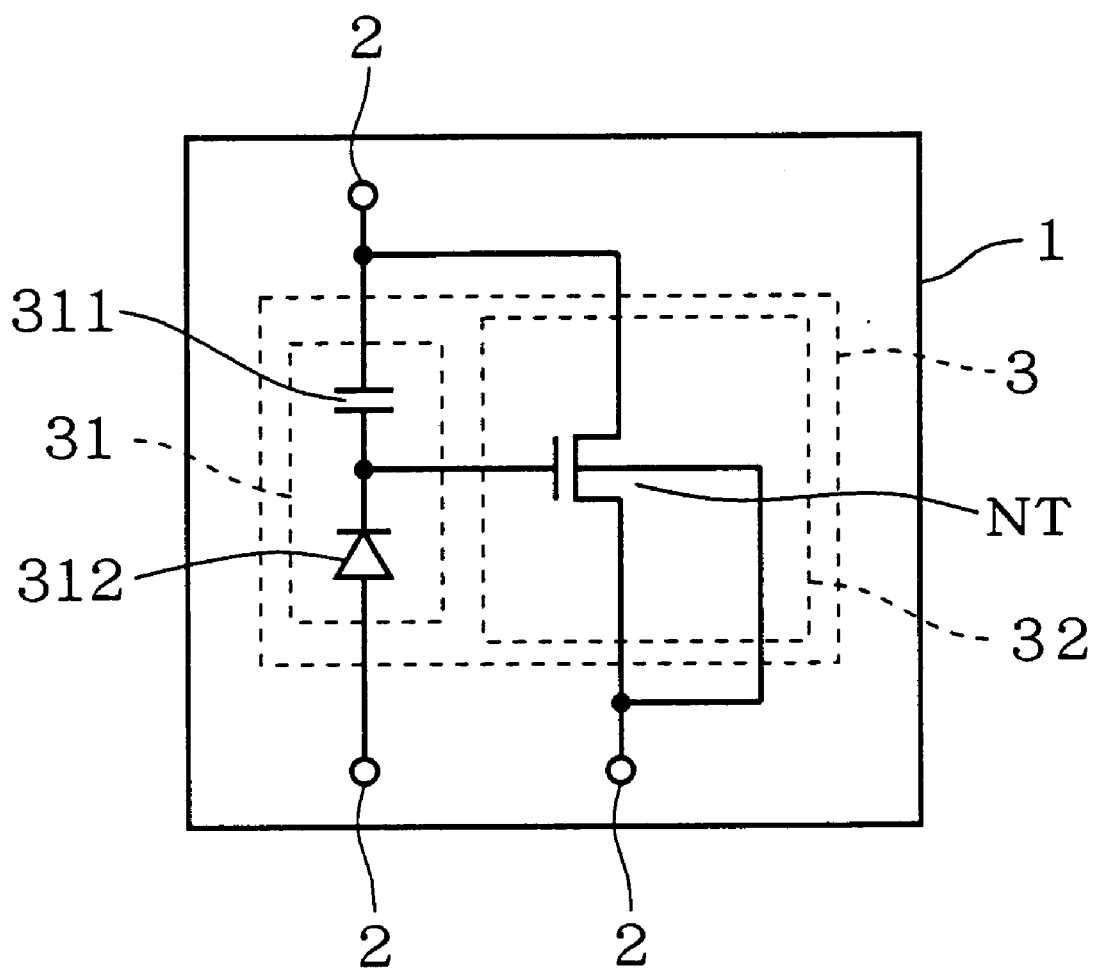

MEMORY CELL EVALUATION SEMICONDUCTOR DEVICE, METHOD OF FABRICATING THE SAME AND MEMORY CELL EVALUATION METHOD

BACKGROUND OF THE INVENTION

1. Field of the Invention

The present invention relates to a characteristic evaluation semiconductor device (TEG: test element group), and more particularly, it relates to a memory cell evaluation semiconductor device for evaluating a memory cell, a method of fabricating the same and a memory cell evaluation method.

2. Description of the Background Art

The operation of a memory cell included in a DRAM is now described with reference to FIGS. 51 to 54. A capacitor which is formed by a counter electrode CP and a storage node electrode SN stores charges, thereby writing data in the memory cell (FIG. 51). The capacitor holds the charges stored therein, thereby holding the data in the memory cell (FIG. 52). In practice, however, the charges may move through a dielectric film provided between the counter electrode CP and the storage node electrode SN to result in the so-called capacitor leakage (FIG. 53) or may move between the capacitor and a part enclosing the same to result in the so-called junction leakage (FIG. 54). Due to a leakage current resulting from such movement of the charges, the memory cell cannot hold but loses the data. Therefore, the DRAM rewrites the data in the memory cell before losing the same. The DRAM periodically performs this operation, which is called a refresh operation.

The recent DRAM is generally applied to a portable appliance such as a portable telephone, a mobile computer or the like, and must have small power consumption. However, the DRAM consumes power every refresh operation. Therefore, the DRAM maximizes the interval (hereinafter referred to a refresh execution interval) for performing the refresh operation while preventing loss of the data, thereby reducing the number of times for executing the refresh operation and reducing power consumption of the DRAM.

In order to prevent data loss in a number of memory cells provided in the DRAM, a number of memory cell samples are prepared for deciding the refresh execution interval on the basis of a sample exhibiting the shortest time up to loss of written data.

FIG. 55 is a graph statistically showing the relation between data loss and the refresh execution interval. Referring to FIG. 55, the horizontal axis shows an average refresh execution interval and the longitudinal axis shows the data loss probability. When the refresh execution interval is within the range of 0 to T0, the data loss probability is zero, i.e., no data is lost in any memory cell of the DRAM. When the refresh execution interval exceeds T0, on the other hand, data is lost in at least in one memory cell of the DRAM. Referring to FIG. 55, the most efficient refresh execution interval for reducing power consumption is T0.

Two methods are employable for extending the refresh execution interval. The first method, which is adapted to entirely move the curve as shown in FIG. 56, can be implemented by improving the aforementioned leakage current as to all memory cells provided in the DRAM (this method is hereinafter referred to as "large pattern improvement"). The second method, which is adapted to zero the data loss probability around T0 as shown in FIG. 57, can be implemented by improving a specific memory cell having an inferior characteristic as to the leakage current, for example, among the memory cells provided in the DRAM (this method is hereinafter referred to as "small pattern improvement). It is effective for the small pattern improvement to statistically evaluate a number of memory cells, as shown in the graph of FIG. 55.

The difference between these two methods is now described with reference to FIGS. 58 to 60. FIGS. 58 and 59 are conceptual diagrams showing the structure of the DRAM comprising an aggregate DM of a number of memory cells MC. Referring to FIGS. 58 and 59, black squares denote defective memory cells MC. FIG. 60 is a graph showing the relation between voltages applied to the aggregate DM and leakage currents. Referring to FIG. 60, symbols ISA, ISL and IL represent an average leakage current caused in each memory cell MC, a leakage current of each defective memory cell MC and a leakage current flowing out from the aggregate DM respectively.

In the aforementioned large pattern improvement, a test in a development stage is easy to perform since the test is made on the overall aggregate DM shown in FIG. 58 by checking the leakage current IL flowing out from the same. However, the leakage current ISL, which is included in the leakage current IL, is undetectable.

In the small pattern improvement, on the other hand, it is difficult to perform a test, which is made on each memory cell MC shown in FIG. 59 by checking the leakage current IS flowing out from the same. In order to find out a memory cell MC having an inferior characteristic as to the leakage current, further, the respective ones of the memory cells MC forming the aggregate DM must be tested. However, the leakage current ISL is detectable.

Thus, the small pattern improvement is not employed in general due to the difficulty of the test as compared with the large pattern improvement.

However, electric fields in the memory cells tend to increase following the increased scale of the recent DRAM, and it is difficult to extend the refresh execution interval through the large pattern improvement.

Therefore, the refresh execution interval may be extended by the small pattern improvement. However, it is impossible to make the best use of the small pattern improvement, since there is no method of evaluating a single memory cell.

SUMMARY OF THE INVENTION

A memory cell evaluation semiconductor device according to a first aspect of the present invention comprises a semiconductor substrate, a plurality of pads which are formed on the semiconductor substrate, and at least one memory cell evaluation part, formed on the semiconductor substrate, including a dummy cell part which is provided with a capacitor having a first end connected to one of the plurality of pads and a P-N junction element having a first end connected to a second end of the capacitor and a second end connected to one of the plurality of pads and a sense part connected to the second end of the capacitor for sensing the potential of the capacitor and outputting the result of sensing to one of the plurality of pads.

In the memory cell evaluation semiconductor device according to the first aspect of the present invention, the potential of the capacitor to be evaluated can be effectively evaluated by observing the result of sensing outputted from the pad connected with the sense part.

According to a second aspect of the present invention, the sense part comprises a MOS transistor including a gate electrode which is connected to the second end of the capacitor, a source electrode which is connected to one of the plurality of pads, a drain electrode which is connected to one of the plurality of pads, and a back-gate electrode which is connected to one of the plurality of pads.

In the memory cell evaluation semiconductor device according to the second aspect of the present invention, an input of the sense part is isolated by a gate insulating film, whereby charges stored in the capacitor do not flow out from the sense part.

According to a third aspect of the present invention, the MOS transistor is of a p type, and the pad which is connected with the source electrode is identical to that connected with the first end of the capacitor.

In the memory cell evaluation semiconductor device according to the third aspect of the present invention, the number of the pads formed on the semiconductor substrate can be effectively reduced.

According to a fourth aspect of the present invention, the MOS transistor is of a p type, and the pad which is connected with the source electrode, that connected with the first end of the capacitor and that connected with the back-gate electrode are identical to each other.

In the memory cell evaluation semiconductor device according to the fourth aspect of the present invention, the number of the pads formed on the semiconductor substrate can be effectively reduced.

According to a fifth aspect of the present invention, the pad which is connected with the source electrode is identical to that connected with the backgate electrode.

In the memory cell evaluation semiconductor device according to the fifth aspect of the present invention, the number of the pads formed on the semiconductor substrate can be effectively reduced.

According to a sixth aspect of the present invention, the MOS transistor is of an n type.

In the memory cell evaluation semiconductor device according to the sixth aspect of the present invention, the gate capacitance of the n-type MOS transistor can be reduced as compared with a p-type MOS transistor, whereby an influence exerted by the sense part on the dummy cell part can be effectively reduced.

According to a seventh aspect of the present invention, the pad which is connected with the drain electrode is identical to that connected with the first end of the capacitor.

In the memory cell evaluation semiconductor device according to the seventh aspect of the present invention, the number of the pads formed on the semiconductor substrate can be effectively reduced.

According to an eighth aspect of the present invention, the memory cell evaluation semiconductor device comprising a plurality of memory cell evaluation parts, and sense parts included in the plurality of memory cell evaluation parts supply the results of sensing to the same pad.

In the memory cell evaluation semiconductor device according to the eighth aspect of the present invention, the results of sensing outputted from the plurality of sense parts can be effectively statistically evaluated.

According to a ninth aspect of the present invention, the memory cell evaluation semiconductor device further comprises a decoder which is connected to some of the plurality of pads for driving the memory cell evaluation parts corresponding to address signals which are applied to the pads.

In the memory cell evaluation semiconductor device according to the ninth aspect of the present invention, a number of memory cell evaluation parts can be effectively formed on the semiconductor device even if the number of pads formable on the semiconductor substrate is limited.

According to a tenth aspect of the present invention, the memory cell evaluation semiconductor device further comprises a dummy cell part forming region which is provided on the semiconductor substrate for forming the dummy cell part, and a sense part forming region which is provided on the semiconductor substrate for forming the sense part, and the dummy cell part forming region and the sense part forming region are electrically isolated from each other.

In the memory cell evaluation semiconductor device according to the tenth aspect of the present invention, the dummy cell part forming region and the sense part forming region can effectively operate in states suppressed from mutual electrical influences.

According to an eleventh aspect of the present invention, the dummy cell part forming region and the sense part forming region are in well structures of the same polarity, and the memory cell evaluation semiconductor device further comprises a well region which is formed between the dummy cell part forming region and the sense part forming region.

In the memory cell evaluation semiconductor device according to the eleventh aspect of the present invention, the dummy cell part forming region and the sense part forming region can effectively operate with no mutual electrical influences by the well region.

According to a twelfth aspect of the present invention, the memory cell evaluation semiconductor device further comprises a dummy cell part forming region which is provided on the semiconductor substrate for forming the dummy cell part, a sense part forming region which is provided on the semiconductor substrate for forming the sense part, and a bottom layer which is formed under the dummy cell part forming region and the sense part forming region.

In the memory cell evaluation semiconductor device according to the twelfth aspect of the present invention, the dummy cell part forming region and the sense part forming region can effectively operate with no electrical influence from a region of the semiconductor substrate located under the bottom layer.

A method of fabricating a memory cell evaluation semiconductor device according to a thirteenth aspect of the present invention comprises steps of forming an element isolation region on a semiconductor substrate for dividing a dummy cell part forming region and a sense part forming region from each other, implanting impurities into the dummy cell part forming region and the sense part forming region respectively, forming a MOS transistor in the sense part forming region, implanting an impurity of a different polarity from that of the impurity implanted into the dummy cell part forming region into a part of the dummy cell part forming region, and forming a capacitor having a storage node electrode connected to the region into which the impurity of the different polarity is implanted and a gate electrode of the MOS transistor and an electrode which is opposed to the storage node electrode through a dielectric body, and the capacitor has the same shape as an object of evaluation.

In the method according to the thirteenth aspect of the present invention, the memory cell evaluation semiconductor device according to the first aspect of the present invention can be effectively fabricated.

According to a fourteenth aspect of the present invention, the method of fabricating a memory cell evaluation semiconductor device further comprises a step of implanting an impurity into a portion which is located under the dummy cell part forming region and the sense part forming region in advance of the step of dividing the dummy cell part forming region and the sense part forming region from each other.

In the method according to the fourteenth aspect of the present invention, the memory cell evaluation semiconductor device according to the twelfth aspect of the present invention can be effectively fabricated.

A memory cell evaluation method according to a fifteenth aspect of the present invention employs a memory cell evaluation semiconductor device comprising a semiconductor substrate, a plurality of pads which are formed on the semiconductor substrate, and at least one memory cell evaluation part, formed on the semiconductor substrate, including a dummy cell part which is provided with a capacitor having a first end connected to one of the plurality of pads and a P-N junction element having a first end connected to a second end of the capacitor and a second end connected to one of the plurality of pads and a sense part connected to the second end of the capacitor for sensing the potential of the capacitor and outputting the result of sensing to one of the plurality of pads, and the sense part comprises a MOS transistor including a gate electrode which is connected to the second end of the capacitor, a source electrode which is connected to one of the plurality of pads, and a drain electrode which is connected to one of the plurality of pads. The memory cell evaluation method comprises (a) a step of applying a forward potential of the P-N junction element to the pad which is connected to the second end of the P-N junction element, (b) a step of detecting a drain current flowing between the pad which is connected with the drain electrode and the pad which is connected with the source electrode, and (c) a step of obtaining a gate voltage of the MOS transistor by comparing a gate voltage-to-drain current characteristic of the MOS transistor and the drain current detected in the step (b).

In the method according to the fifteenth aspect of the present invention, the forward potential is first applied for implanting charges into the capacitor. The potential of the capacitor fluctuates due to movement of the implanted charges caused by a leakage current of the P-N junction element or the capacitor. This fluctuation of the potential of the capacitor can be effectively obtained by the detected drain current and the gate voltage-to-drain current characteristic.

According to a sixteenth aspect of the present invention, the step (a) comprises (a-1) a step of detecting that the drain current flowing between the pad which is connected with the drain electrode and the pad which is connected with the source electrode becomes zero, and (a-2) a step of applying a reverse voltage of the P-N junction element to the pad which is connected with the second end of the P-N junction element when detecting that the drain current becomes zero in the step (a-1).

In the method according to the sixteenth aspect of the present invention, the drain current becomes zero to indicate that the capacitor is sufficiently charged. Thus, implantation of the charges into the capacitor can be effectively stopped by applying the reverse voltage to the P-N junction element after confirming that the capacitor is charged.

According to a seventeenth aspect of the present invention, the memory cell evaluation method further comprises (d) a step of supplying a potential of not more than 0 V to the pad which is connected with the drain electrode.

In the method according to the seventeenth aspect of the present invention, small change of the potential of the capacitor can be effectively stably evaluated regardless of fluctuation of the potential applied to the pad.

According to an eighteenth aspect of the present invention, the step (c) comprises (c-1) a step of obtaining the gate voltage through a saturated region in the gate voltage-to-drain current characteristic of the MOS transistor.

In the method according to the eighteenth aspect of the present invention, the gate voltage can be effectively accurately obtained by employing the saturated region in the gate voltage-to-drain current characteristic of the MOS transistor.

According to a nineteenth aspect of the present invention, a back-gate electrode of the MOS transistor is connected to one of the plurality of pads, and the memory cell evaluation method further comprises (d) a step of supplying a potential for shifting the saturated region to the pad which is connected with the back-gate electrode.

In the method according to the nineteenth aspect of the present invention, small change of a desired gate voltage can be effectively accurately obtained by shifting the saturated region.

According to a twentieth aspect of the present invention, the potential supplied to the pad which is connected with the back-gate electrode in the step (d) is higher than that supplied to the pad which is connected with the source electrode.

In the method according to the twentieth aspect of the present invention, the saturated region can be effectively shifted in a direction for improving the sensitivity.

Accordingly, an object of the present invention is to provide a memory cell evaluation semiconductor device which can evaluate a single memory cell, a method of fabricating the same and a memory cell evaluation method.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 13 is a conceptual diagram of still another memory cell evaluation semiconductor device according to the embodiment 6 of the present invention;

DESCRIPTION OF THE PREFERRED EMBODIMENTS

Embodiment 1

Figure 1:
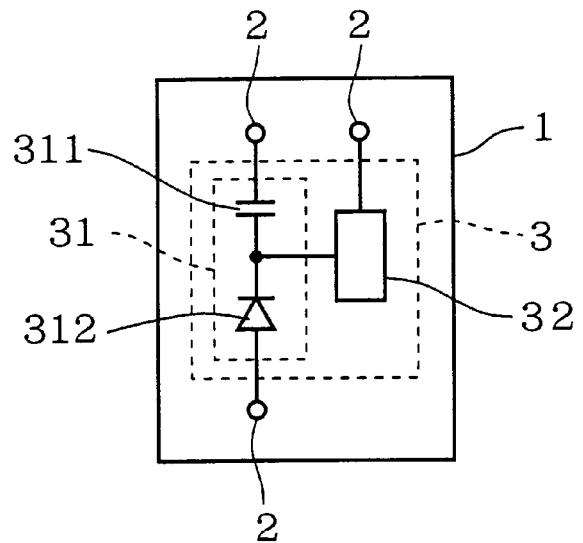
FIG. 1 is a conceptual diagram of a memory cell evaluation semiconductor device according to the present invention.

FIG. 1 illustrates the concept of a memory cell evaluation semiconductor device according to the present invention. Referring to FIG. 1, the semiconductor device comprises a p-type semiconductor substrate 1, pads 2 which are formed on the semiconductor substrate 1 to be brought into contact with a probe of a tester or the like, and a memory cell evaluation part 3.

The memory cell evaluation part 3 includes a dummy cell part 31 and a sense part 32. The dummy cell part 31 is provided with a capacitor 311 having a first end which is connected to one of the plurality of pads 2 and a P-N junction element 312 having a first end which is connected to a second end of the capacitor 311 and a second end which is connected to one of the plurality of pads 2. The sense part 32 is connected to the second end of the capacitor 311 for sensing its potential and outputting the result of sensing to one of the plurality of pads 2.

The capacitor 311 has the same structure as an object of evaluation (a capacitor in a memory cell of a DRAM). The second end of the capacitor 311 which is connected with the P-N junction element 312 is the storage node electrode, which is described above with reference to the prior art.

The operation is now described. First, a forward potential is supplied to the pad 2 which is connected with the second end of the P-N junction element 312, thereby implanting charges in the storage node electrode of the capacitor 311. The charges implanted into the storage node electrode move due to capacitor leakage of the capacitor 311 or junction leakage of the P-N junction element 312, to change the potential of the storage node electrode of the capacitor 311. The capacitor leakage of the capacitor 311 and the junction leakage of the P-N junction element 312 correspond to those described with reference to the prior art. The sense part 32 outputs a signal responsive to the change of the potential of the storage node electrode to the pad 2. The signal outputted from the pad 2 connected with the sense part 32 is observed with the tester. The potential change of the storage node electrode of the capacitor 311 can be evaluated on the basis of the result of this observation.

Figure 2:
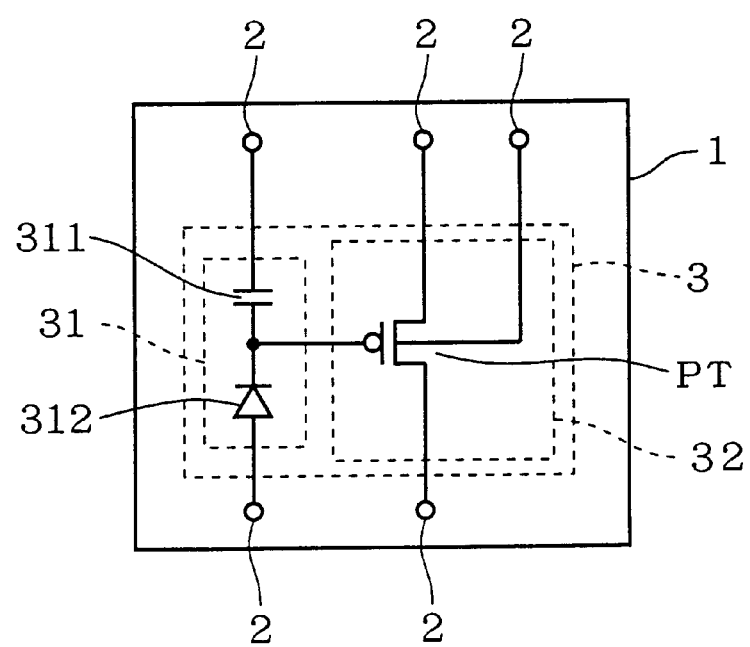
FIG. 2 is a conceptual diagram of a memory cell evaluation semiconductor device according to an embodiment 1 of the present invention.

FIG. 2 is a conceptual diagram of a memory cell evaluation semiconductor device according to an embodiment 1 of the present invention. Reference numerals appearing in FIG. 2 correspond to those in FIG. 1. Referring to FIG. 2, a sense part 32 consists of only a p-type MOS transistor PT. The MOS transistor PT has a gate electrode which is connected to a storage node electrode of a capacitor 311, a source electrode which is connected to one of a plurality of pads 2, a drain electrode which is connected to one of the plurality of pads 2, and a back-gate electrode which is connected to one of the plurality of pads 2. A drain current ID flowing between the source electrode and the drain electrode of the MOS transistor PT changes in response to the potential of the storage node of the capacitor 311.

Figure 3:
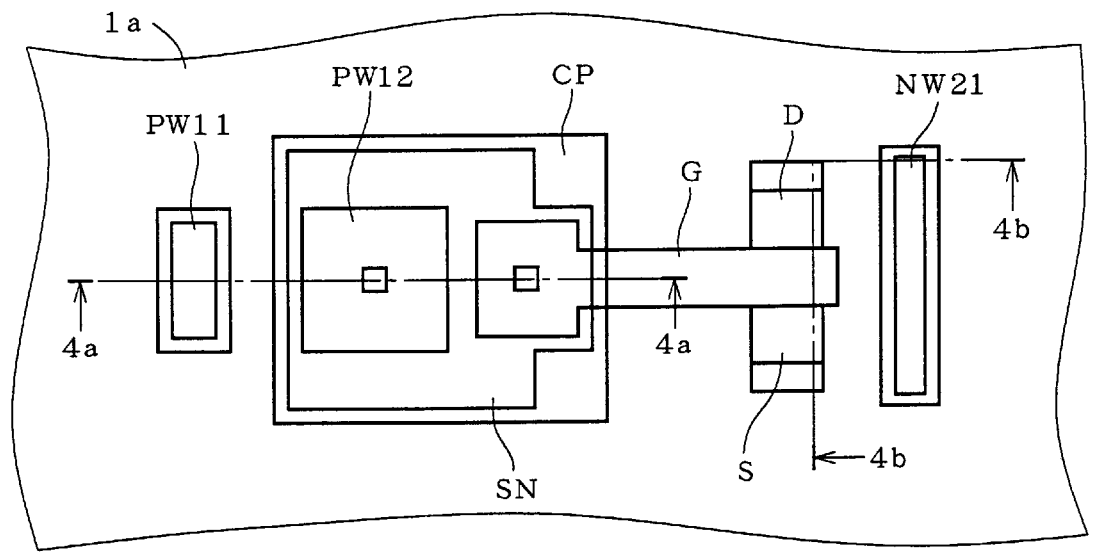
FIG. 3 is a layout diagram showing an example of the memory cell evaluation semiconductor device according to the embodiment 1 of the present invention.
Figure 4:
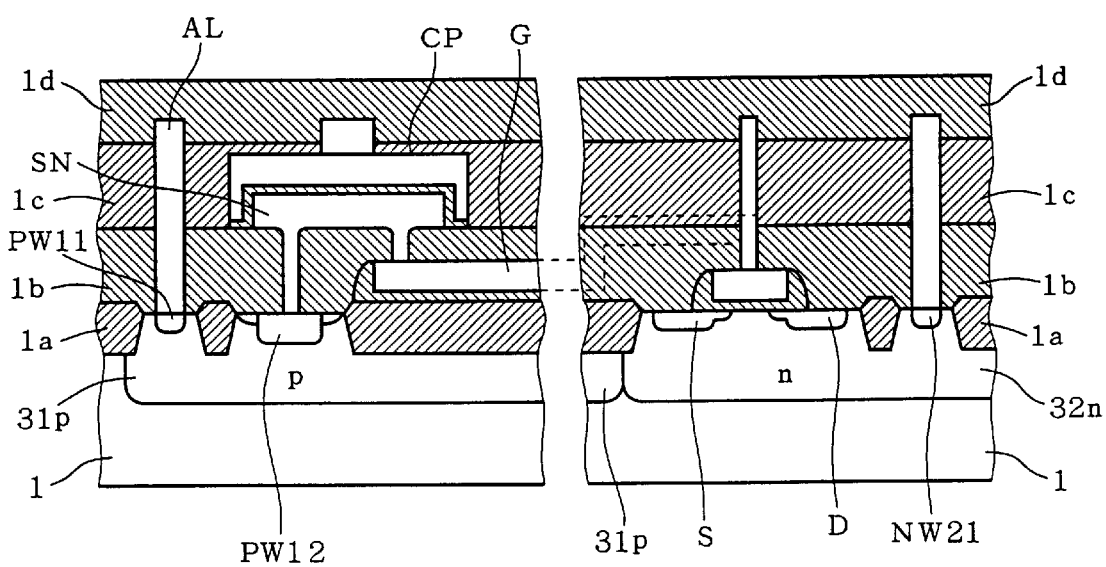
FIG. 4 illustrates sectional views showing the example of the memory cell evaluation semiconductor device according to the embodiment 1 of the present invention.

FIG. 3 is a layout diagram of the memory cell evaluation semiconductor device shown in FIG. 2. FIG. 4 illustrates sectional views taken along the one-dot chain lines 4a—4a and 4b—4b in FIG. 3 respectively. Referring to FIGS. 3 and 4, symbols G, S and D denote the gate electrode, the source electrode and the drain electrode of the MOS transistor PT respectively, and numerals 31p and 32n denote a p-type well region which is a dummy cell part forming region and an n-type well region which is a sense part forming region respectively. Further, symbols CP and SN denote a first electrode of the capacitor 311 and the storage node electrode which is a second electrode of the capacitor 311 respectively, symbols PW12 and PW11 denote electrodes of high-concentration n-type and p-type impurity regions forming the first and second ends of the P-N junction element 312 respectively, symbol NW denotes a high-concentration n-type impurity region forming the back-gate electrode of the MOS transistor PT, numeral 1a denotes an element isolation film, numerals 1b and 1c denote interlayer isolation films, and numeral 1d denotes a passivation film. Referring to FIGS. 3 and 4, a p-type impurity is implanted into the source electrode S and the drain electrode D.

The embodiment 1 of the present invention attains the following effects: Namely, small change of a potential of a storage node of a single memory cell can be evaluated by observing a signal outputted from the pad 2 which is connected to the sense part 32.

Further, the sense part 32 can be simply formed by the MOS transistor PT.

In the memory cell evaluation part 3, the dummy cell part 31 is modeled on an object of evaluation, while the sense part 32 is not included in this object of evaluation. Therefore, the sense part 32 preferably exerts no influence on the dummy cell part 31. Referring to FIG. 3, a gate insulating film isolates an input of the sense part 32, whereby no charges of the storage node electrode SN flow out to the remaining parts through the sense part 32. Thus, the sense part 32 exerts no influence on the dummy cell part 31 in relation to the charge quantity, whereby the object of evaluation can be accurately evaluated.

Embodiment 2

Figure 5:
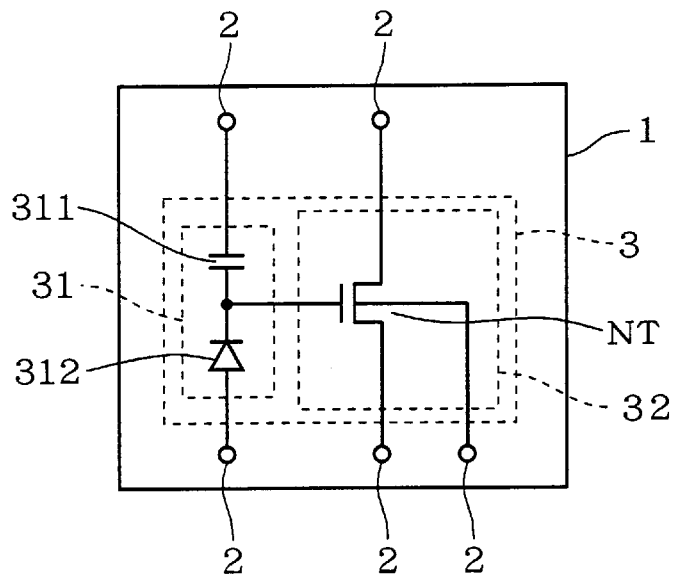
FIG. 5 is a conceptual diagram of a memory cell evaluation semiconductor device according to an embodiment 2 of the present invention.

FIG. 5 is a conceptual diagram of a memory cell evaluation semiconductor device according to an embodiment 2 of the present invention. Referring to FIG. 5, a sense part 32 consists of only an n-type MOS transistor NT, while the remaining structure is similar to that shown in FIG. 2.

Figure 6:
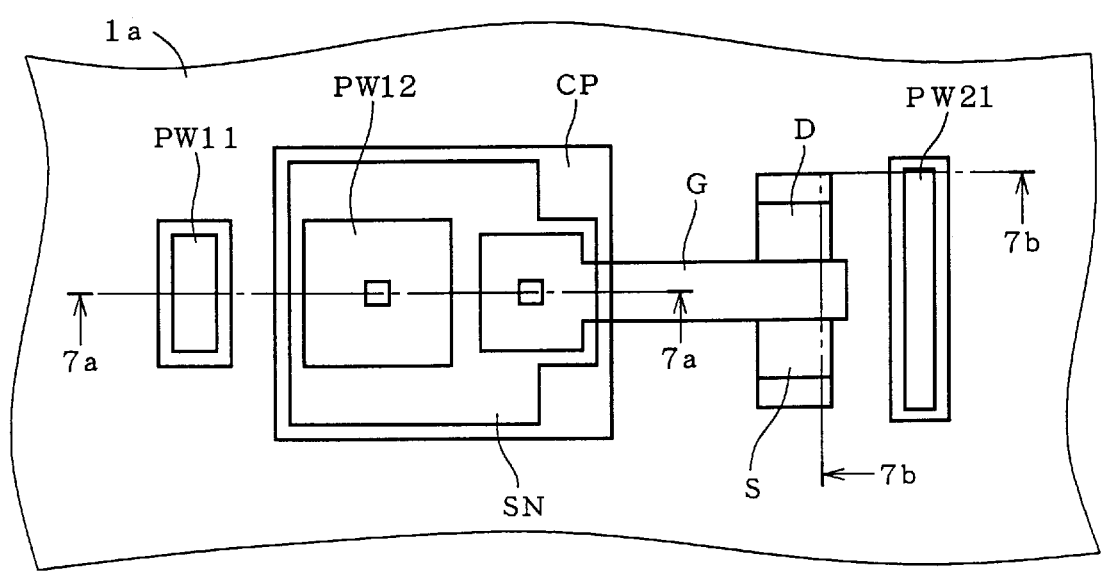
FIG. 6 is a layout diagram showing an example of the memory cell evaluation semiconductor device according to the embodiment 2 of the present invention.
Figure 7:
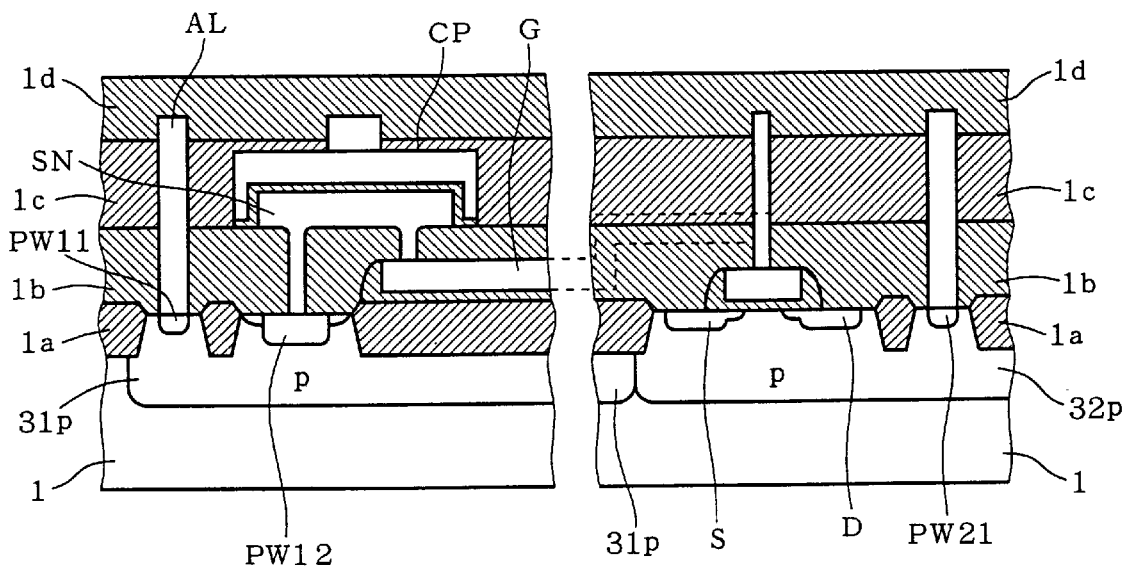
FIG. 7 shows sectional views illustrating the example of the memory cell evaluation semiconductor device according to the embodiment 2 of the present invention.

FIG. 6 is a layout diagram of the memory cell evaluation semiconductor device shown in FIG. 5. FIG. 7 shows sectional views taken along the one-chain dot lines 7a—7a and 7b—7b in FIG. 6 respectively. Referring to FIGS. 6 and 7, symbol PW21 denotes a high-concentration p-type impurity region forming a back-gate electrode of the MOS transistor NT and numeral 32p denotes a p-type well region which is a sense part forming region, while the remaining symbols and numerals denote elements similar to those shown in FIGS. 3 and 4. Referring to FIGS. 6 and 7, an n-type impurity is implanted into a source electrode S and a drain electrode D.

The embodiment 2 of the present invention attains the following effect: It is known that a smaller current (gate current) flows between a channel and a gate electrode of an n-type MOS transistor as compared with a p-type MOS transistor (refer to "Submicron Device II" by Mitsumasa Koyanagi, Maruzen Co., Ltd.). According to the embodiment 2 of the present invention, therefore, it is possible to reduce influence exerted by a sense part 32 on a dummy cell part 31 on the basis of a gate current as compared with the embodiment 1 provided with the sense part 32 formed by only the p-type MOS transistor PT.

Embodiment 3

Figure 8:
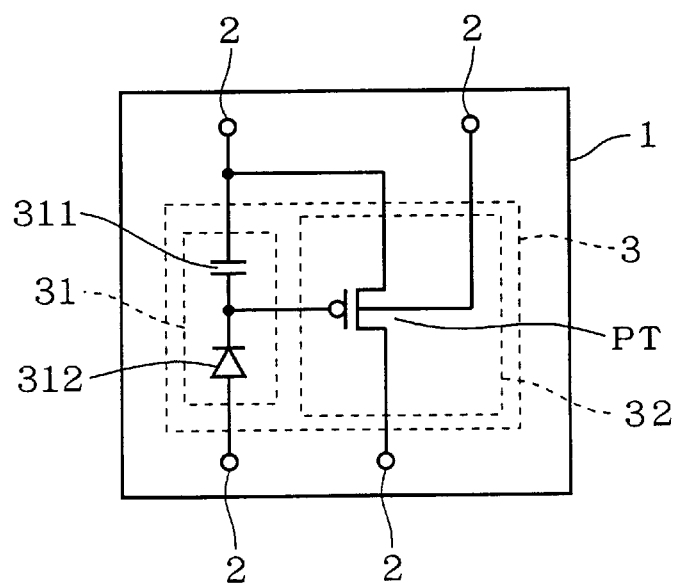
FIG. 8 is a conceptual diagram of a memory cell evaluation semiconductor device according to an embodiment 3 of the present invention.

FIG. 8 is a conceptual diagram of a memory cell evaluation semiconductor device according to an embodiment 3 of the present invention. The number of pads 2 formed on a p-type semiconductor substrate 1 is generally limited due to a factor such as the layout area or the limit in the number of the pads 2 simultaneously probeable by a tester, regardless of a memory cell evaluation part 3. As shown in FIG. 8, therefore, a capacitor 311 and a source electrode of a MOS transistor PT are connected with the same pad 2, thereby reducing the number of the pads 2. The remaining structure of this embodiment is similar to that shown in FIG. 2.

The embodiment 3 of the present invention attains the following effects: The number of the pads 2 connected to the memory cell evaluation part 3 is reduced, whereby the total number of the pads 2 can be limited within a certain range. Further, the pad 2 connected with a back-gate electrode of the MOS transistor PT is independent, whereby the substrate potential of the MOS transistor PT can be freely adjusted.

Embodiment 4

Figure 9:
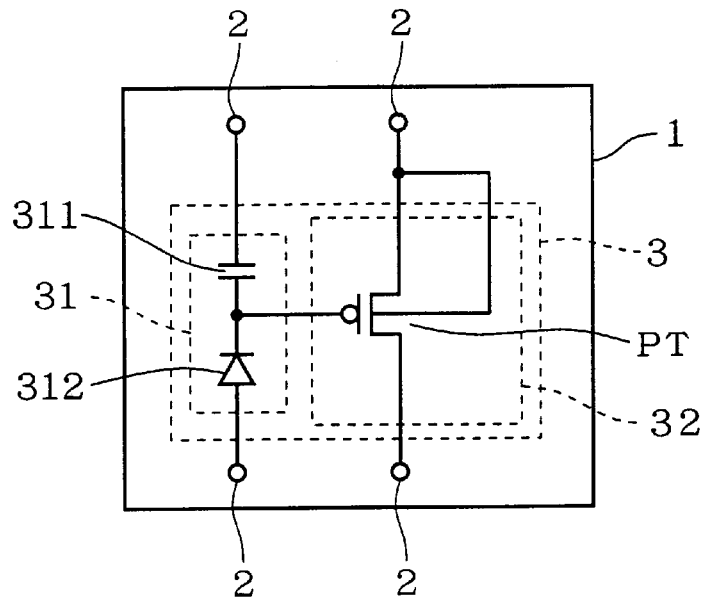
FIG. 9 is a conceptual diagram of a memory cell evaluation semiconductor device according to an embodiment 4 of the present invention.

FIG. 9 is a conceptual diagram of a memory cell evaluation semiconductor device according to an embodiment 4 of the present invention. As shown in FIG. 9, a source electrode and a back-gate electrode of a MOS transistor PT are connected with the same pad 2, thereby reducing the number of pads 2. The remaining structure of this embodiment is identical to that shown in FIG. 2.

The embodiment 4 of the present invention attains the following effect: The number of the pads 2 connected to a memory cell evaluation part 3 is reduced, whereby the total number of the pads 3 can be limited within a certain range, as described with reference to the embodiment 3 of the present invention.

Embodiment 5

Figure 10:
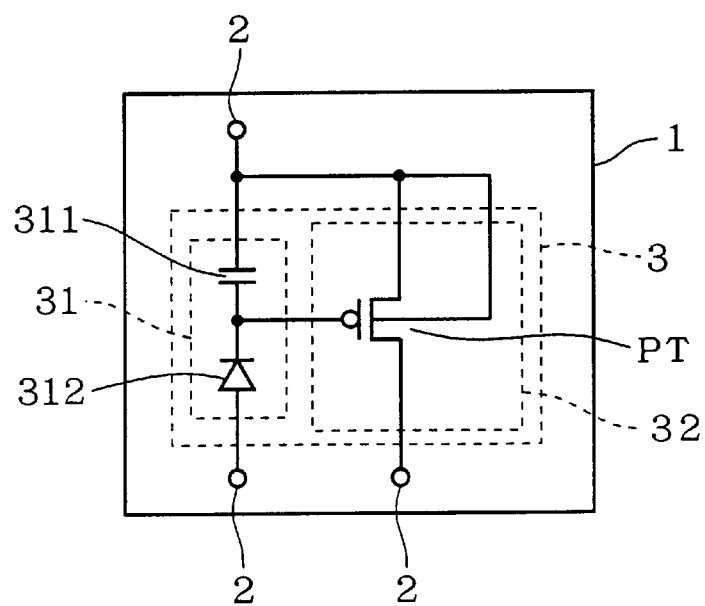
FIG. 10 is a conceptual diagram of a memory cell evaluation semiconductor device according to an embodiment 5 of the present invention.

FIG. 10 is a conceptual diagram of a memory cell evaluation semiconductor device according to an embodiment 5 of the present invention. As shown in FIG. 10, a source electrode and a back-gate electrode of a MOS transistor PT and a capacitor 311 are connected with the same pad 2, thereby reducing the total number of pads 2. The remaining structure of this embodiment is identical to that shown in FIG. 2.

The embodiment 5 of the present invention attains the following effects: The number of the pad 2 connected to a memory cell evaluation part 3 is reduced, whereby the total number of the pads 3 can be limited within a certain range, as described with reference to the embodiment 3 of the present invention. In the embodiment 5 of the present invention, further, the number of the pads 2 is smaller than those in the embodiments 3 and 4.

Embodiment 6

Figure 11:
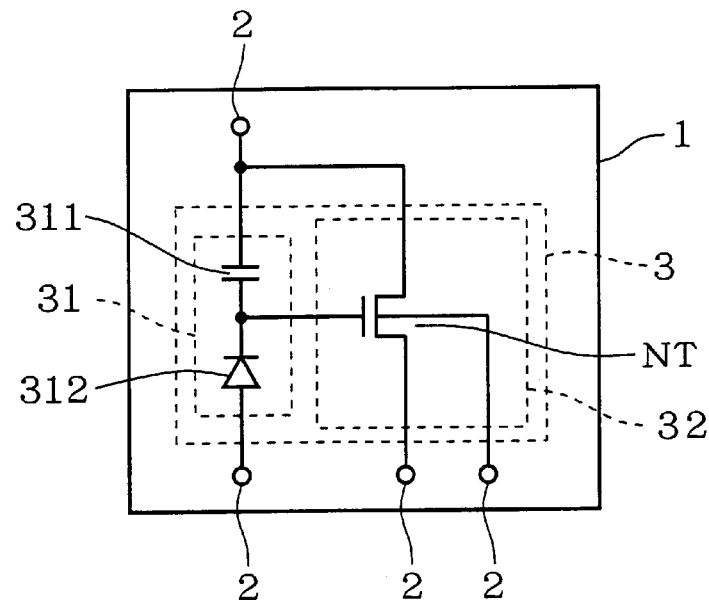
FIG. 11 is a conceptual diagram of a memory cell evaluation semiconductor device according to an embodiment 6 of the present invention.
Figure 12:
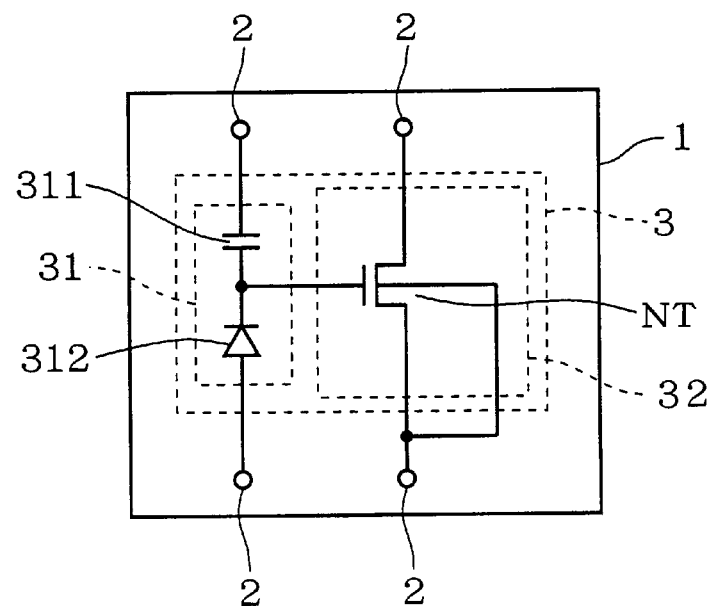
FIG. 12 is a conceptual diagram of another memory cell evaluation semiconductor device according to the embodiment 6 of the present invention.

FIGS. 11 to 13 are conceptual diagrams showing memory cell evaluation semiconductor devices according to an embodiment 6 of the present invention. In each of the memory cell evaluation semiconductor devices according to the embodiment 6, some of the pads 2 shown in FIG. 5 are united, similarly to the embodiments 3 to 5.

Referring to FIG. 11, a capacitor 311 and a drain electrode of a MOS transistor NT are connected with the same pad 2. Referring to FIG. 12, a source electrode and a back-gate electrode of a MOS transistor NT are connected with the same pad 2. Referring to FIG. 13, a capacitor 311 and a drain electrode of a MOS transistor NT are connected with the same pad 2, while a source electrode and a back-gate electrode of the MOS transistor NT are connected with another same pad 2.

The embodiment 6 of the present invention attains the following effects: The number of the pads 2 connected to a memory cell evaluation part 3 is reduced, whereby the total number of the pads 3 can be limited within a certain range, as described with reference to the embodiment 3 of the present invention. Referring to FIG. 11, a pad 2 connected to a back-gate electrode of the MOS transistor NT is independent, whereby the substrate potential of the MOS transistor NT can be freely adjusted. Referring to FIG. 13, the number of the pads 2 is smaller than those in the embodiments 3 and 4.

Embodiment 7

Consider that a positive voltage is applied to the electrode PW11 in FIG. 4. The positive voltage is also applied to the p-type semiconductor substrate 1, since both of the p-type well region 31p and the p-type semiconductor substrate 1 are of the p type. When elements such as MOS transistors are formed on the p-type semiconductor substrate 1 in addition to the dummy cell part 31 and the sense part 32, therefore, the p-type semiconductor substrate 1 may influence the substrate potential of any of such elements formed on the p-type semiconductor substrate 1. The element having the substrate potential influenced by the p-type semiconductor substrate 1 is significantly restricted in operation.

Figure 14:
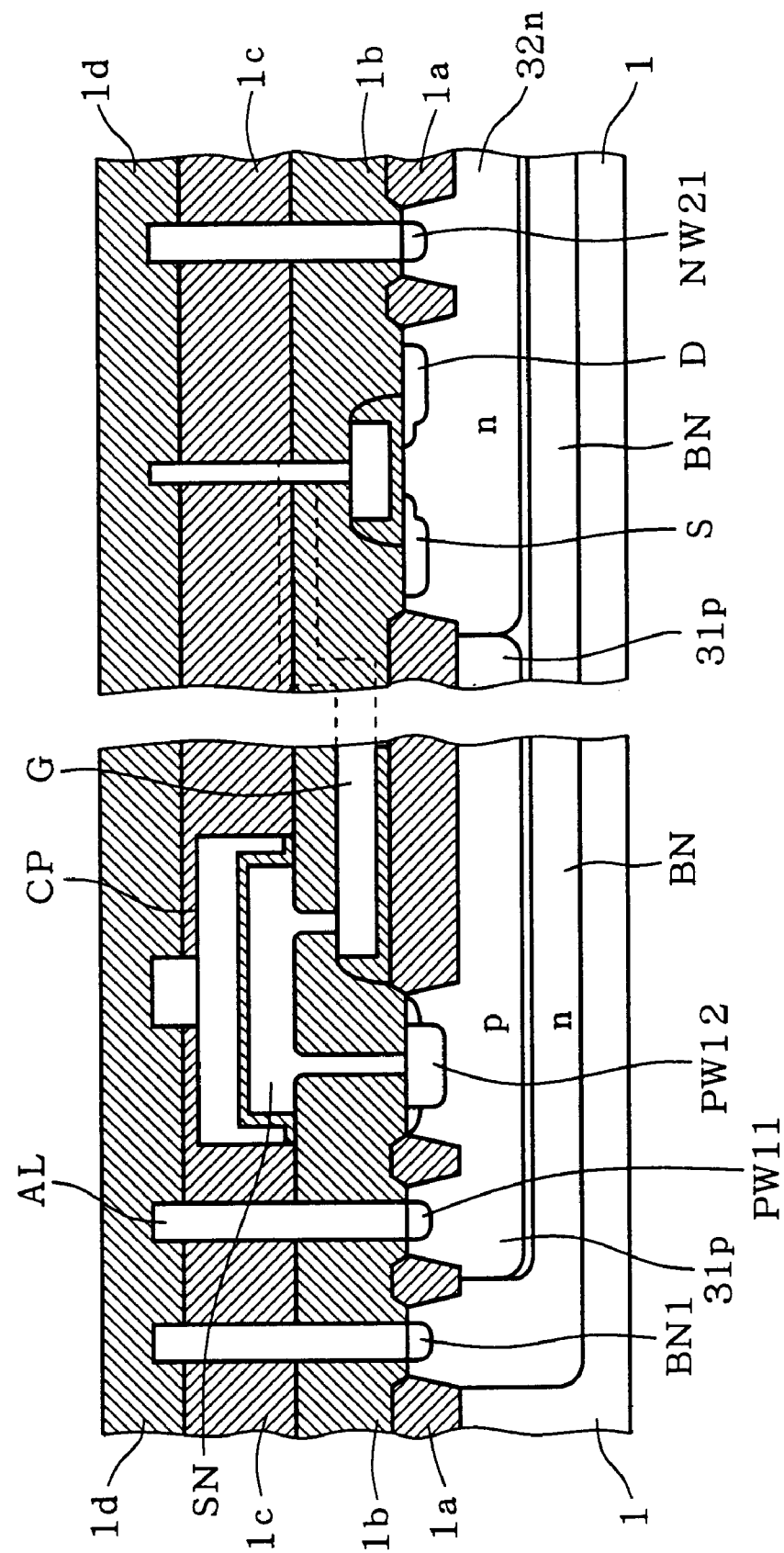
FIG. 14 is a conceptual diagram showing an exemplary memory cell evaluation semiconductor device according to an embodiment 7 of the present invention.

In consideration of this, a memory cell evaluation semiconductor device according to an embodiment 7 of the present invention employs a triple well structure. As shown in FIG. 14, a bottom layer BN of an n-type impurity region is provided in a p-type semiconductor substrate 1. A dummy cell part 31, a sense part 32, and other elements are formed on the bottom layer BN. The bottom layer BN is provided with an electrode BN1 which is a high-concentration n-type impurity region for fixing the potential of the bottom layer BN. This electrode BN1 is connected with a pad 2 through an aluminum wire AL.

The electrode BN1 is supplied with a fixed potential such as a ground potential. Even if a positive voltage is applied to an electrode PW11, no positive voltage is applied to a portion of the semiconductor substrate 1 located under the bottom layer BN. The potential of the portion of the p-type semiconductor substrate 1 located under the bottom layer BN exerts no influence on the substrate potentials of the elements formed on the portion above the bottom layer BN.

The embodiment 7 of the present invention attains the following effects: The bottom layer BN prevents the potential of the portion of the p-type semiconductor substrate 1 located under the same from influencing the substrate potentials of the elements. Therefore, each element can operate with no influence by the potential of the p-type semiconductor substrate 1.

Embodiment 8

Referring to FIG. 7, the p-type well regions 31p and 32p, which are of the same p type, are in contact with each other. Therefore, the substrate potentials of the dummy cell part 31 and the sense part 32 influence each other.

In consideration of this, a memory cell evaluation semiconductor device according to an embodiment 8 of the present invention isolates p-type well regions 31p and 32p from each other with a sufficient distance, and comprises an n-type well region NW3 between the p-type well regions 31p and 32p. A bottom portion of the n-type well region NW3 is located downward beyond those of the p-type well regions 31p and 32p. A bottom layer BN is provided under the p-type well region 31p and the n-type well region NW3.

The bottom layer BN is provided with an electrode BN1 which is a high-concentration n-type impurity region for fixing the potential of the bottom layer BN. The electrode BN1 is connected to a pad 2 through an aluminum wire AL. The remaining structure of this embodiment is identical to that shown in FIG. 7. While a clearance is defined between the bottom layer BN and the n-type well region NW3 in FIG. 15, the bottom layer BN may alternatively be in contact with the n-type well region NW3.

According to the embodiment 8 of the present invention, as hereinabove described, the bottom layer BN and the n-type well region NW3 enclose the p-type well region 31p, thereby electrically isolating the p-type well region 31p from the p-type well region 32p.

The embodiment 8 of the present invention attains the following effect: A dummy cell part 31 and a sense part 32 can operate in states suppressed from mutual influence by the substrate potentials.

Embodiment 9

Figure 16:
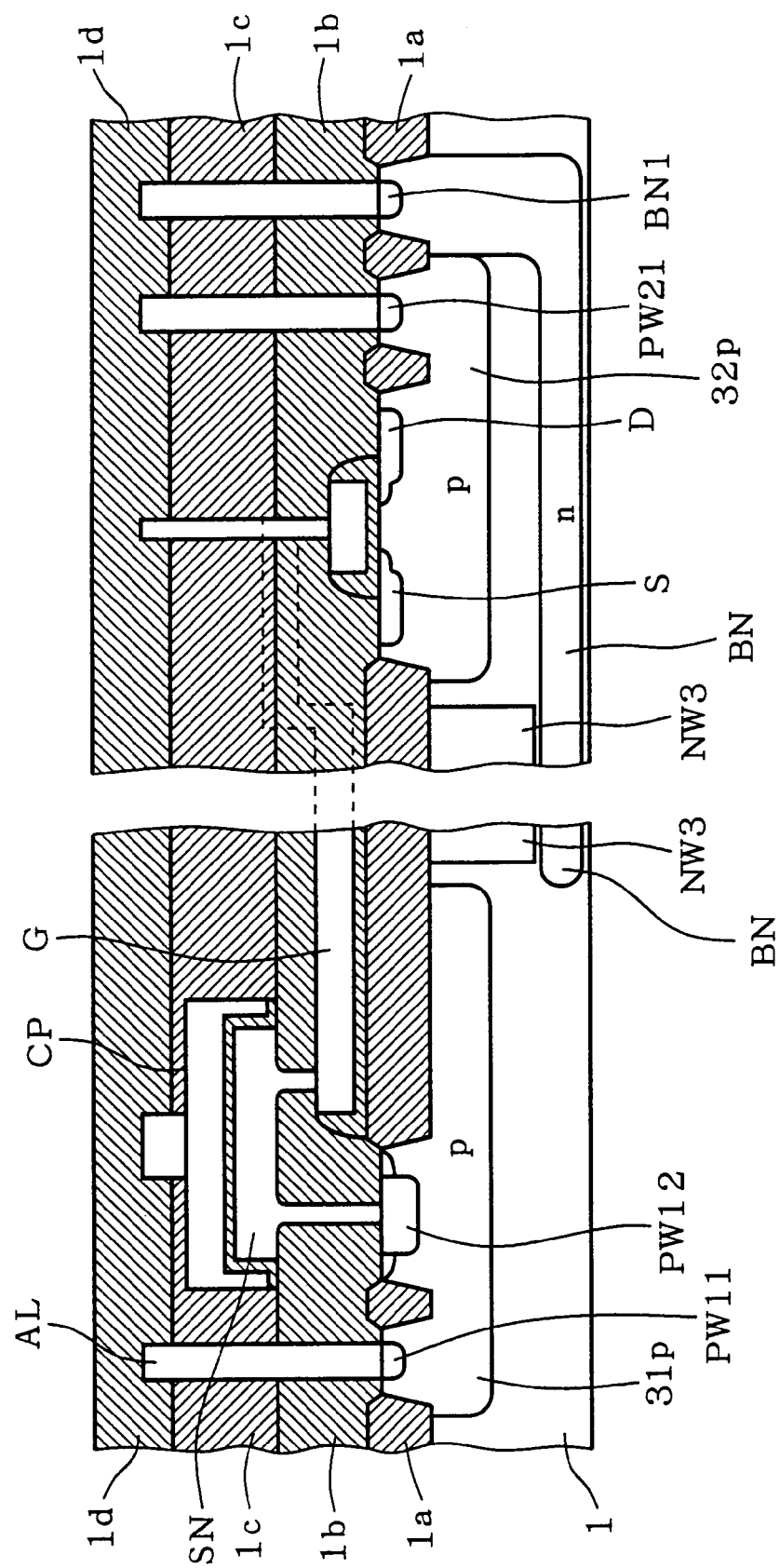
FIG. 16 shows sectional views illustrating an exemplary memory cell evaluation semiconductor device according to an embodiment 9 of the present invention.

A memory cell evaluation semiconductor device according to an embodiment 9 of the present invention is substantially identical to that according to the embodiment 8, except that a bottom layer BN and an n-type well region NW3 enclose a p-type well region 32p. As shown in FIG. 16, the memory cell evaluation semiconductor device isolates the p-type well region 32p from a p-type well region 31p with a sufficient distance, and comprises the n-type well region NW3 between the p-type well regions 31p and 32p. A bottom portion of the n-type well region NW3 is located downward beyond those of the p-type well regions 31p and 32p. The bottom layer BN is provided under the p-type well region 32p and the n-type well region NW3. The bottom layer BN is provided with an electrode BN1 which is a high-concentration n-type impurity region for fixing the potential of the bottom layer BN. The electrode BN1 is connected with a pad 2 through an aluminum wire AL. The remaining structure of this embodiment is similar to that shown in FIG. 7. While a clearance is defined between the bottom layer BN and the n-type well region NW3 in FIG. 16, the bottom layer BN may alternatively be in contact with the n-type well region NW3.

According to the embodiment 9 of the present invention, as hereinabove described, the bottom layer BN and the n-type well region NW3 enclose the p-type well region 32p, thereby electrically isolating the p-type well region 32p from the p-type well region 31p.

The embodiment 9 of the present invention attains the following effect: A dummy cell part 31 and a sense part 32 can operate in states suppressed from mutual influence by the substrate potentials.

Embodiment 10

Figure 15:
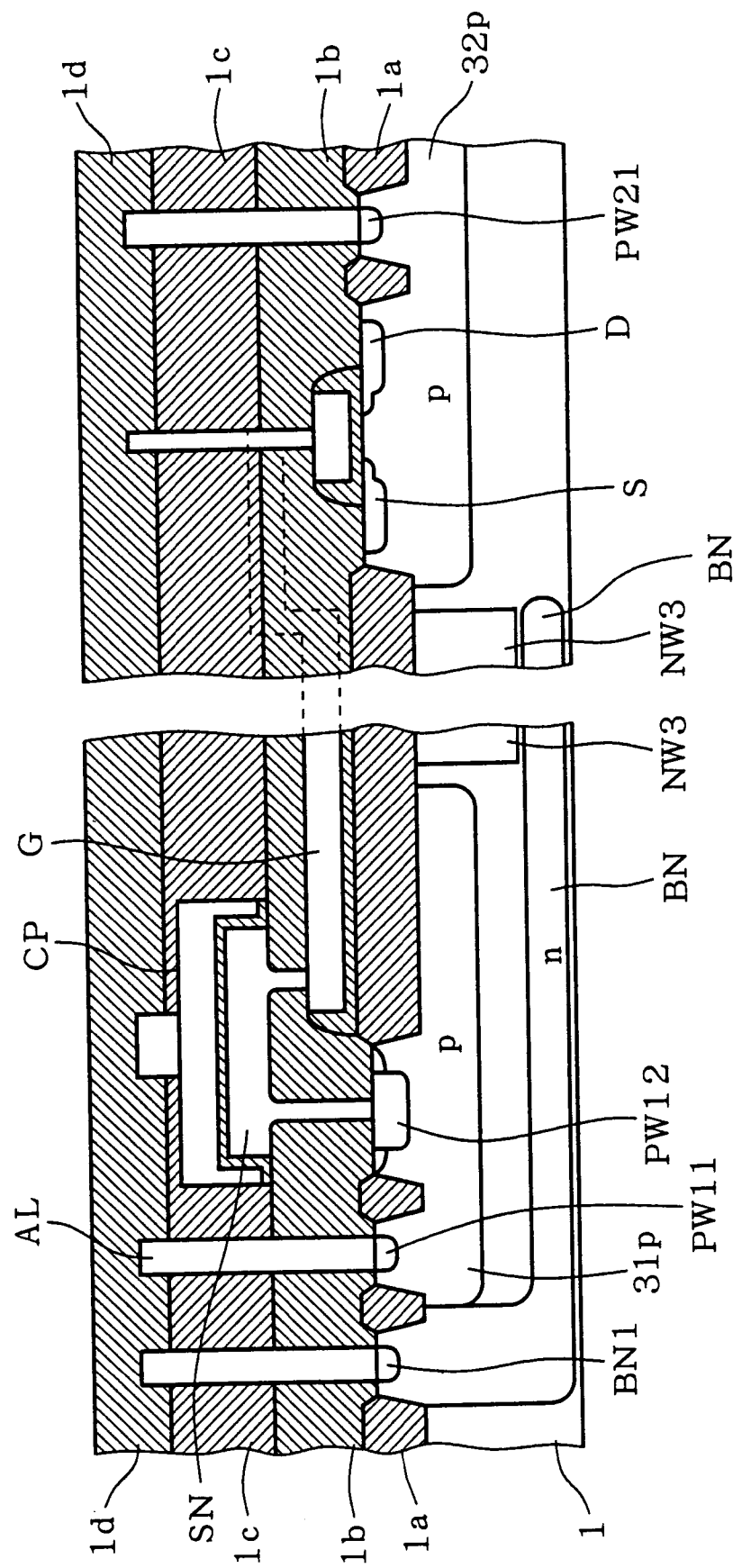
FIG. 15 shows sectional views illustrating an exemplary memory cell evaluation semiconductor device according to an embodiment 8 of the present invention.

In each of the memory cell evaluation semiconductor devices shown in FIGS. 15 and 16, the potential of the p-type semiconductor substrate 1 influences the p-type well region 31p or 32p, since the p-type well regions 31p and 32p and the p-type semiconductor substrate 1 are of the same p type.

Figure 17:
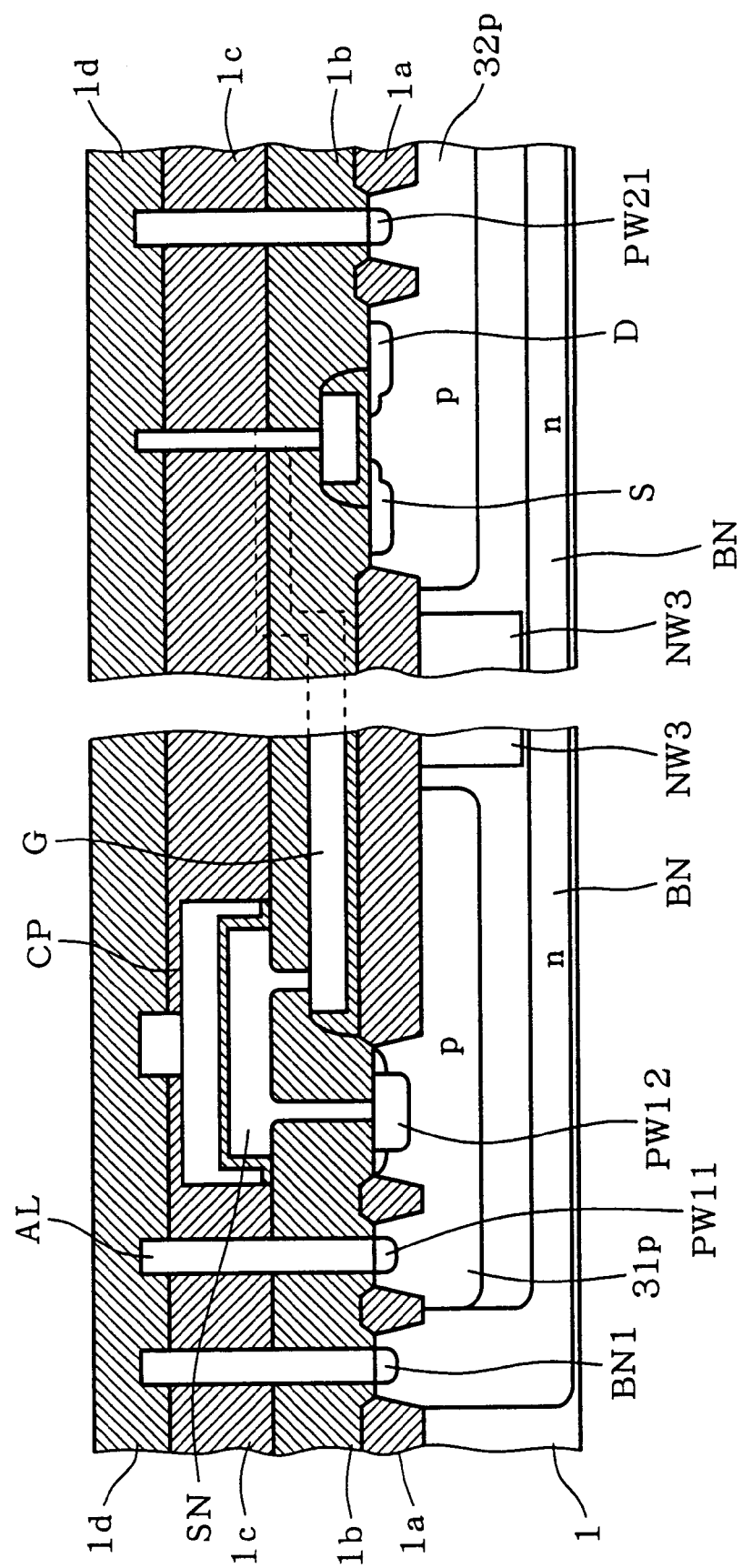
FIG. 17 shows sectional views illustrating an exemplary memory cell evaluation semiconductor device according to an embodiment 10 of the present invention.

In a memory cell evaluation semiconductor device according to an embodiment 10 of the present invention, a bottom layer BN is provided under p-type well regions 31p and 32p, as shown in FIG. 17. The remaining structure of this embodiment is similar to that shown in FIG. 15 or 16.

While a clearance is defined between the bottom layer BN and an n-type well region NW3 in FIG. 17, the bottom layer BN may alternatively be in contact with the n-type well region NW3.

The embodiment 10 of the present invention attains the following effect: The bottom layer BN prevents the potential of a portion of a p-type semiconductor substrate 1 located under the bottom layer BN from influencing the p-type well regions 31p and 32p. Therefore, a dummy cell part 31 and a sense part 32 can operate with no influence by the potential of the p-type semiconductor substrate 1. Further, the dummy cell part 31 and the sense part 32 can operate in states suppressed from mutual influence by the substrate potentials.

Embodiment 11

FIGS. 18 to 21 are conceptual diagrams of memory cell evaluation semiconductor devices according to an embodiment 11 of the present invention. In each memory cell evaluation semiconductor device according to the embodiment 11 of the present invention, a number of memory cell evaluation parts 3 are formed on a single p-type semiconductor substrate 1.

The memory cell evaluation semiconductor devices shown in FIGS. 18 to 21 have 12 pads 2 in common, with different numbers of memory cell evaluation parts 3. The memory cell evaluation semiconductor devices shown in FIGS. 18, 19, 20 and 21 are provided with 9, 12, 20 and 25 memory cell evaluation parts 3 respectively.

Referring to each of FIGS. 18 to 21, the memory cell evaluation parts 3 are identical to that described with reference to the embodiment 7. Symbols L1 to L11 denote wires which are connected with the pads 2 respectively, symbol L12 denotes a wire connected to an electrode BNI which is identical to that described with reference to the embodiment 7, and numeral 300 denotes a memory cell array which is formed by a number of memory cell evaluation parts 3 arranged in the form of an array.

Figure 18:
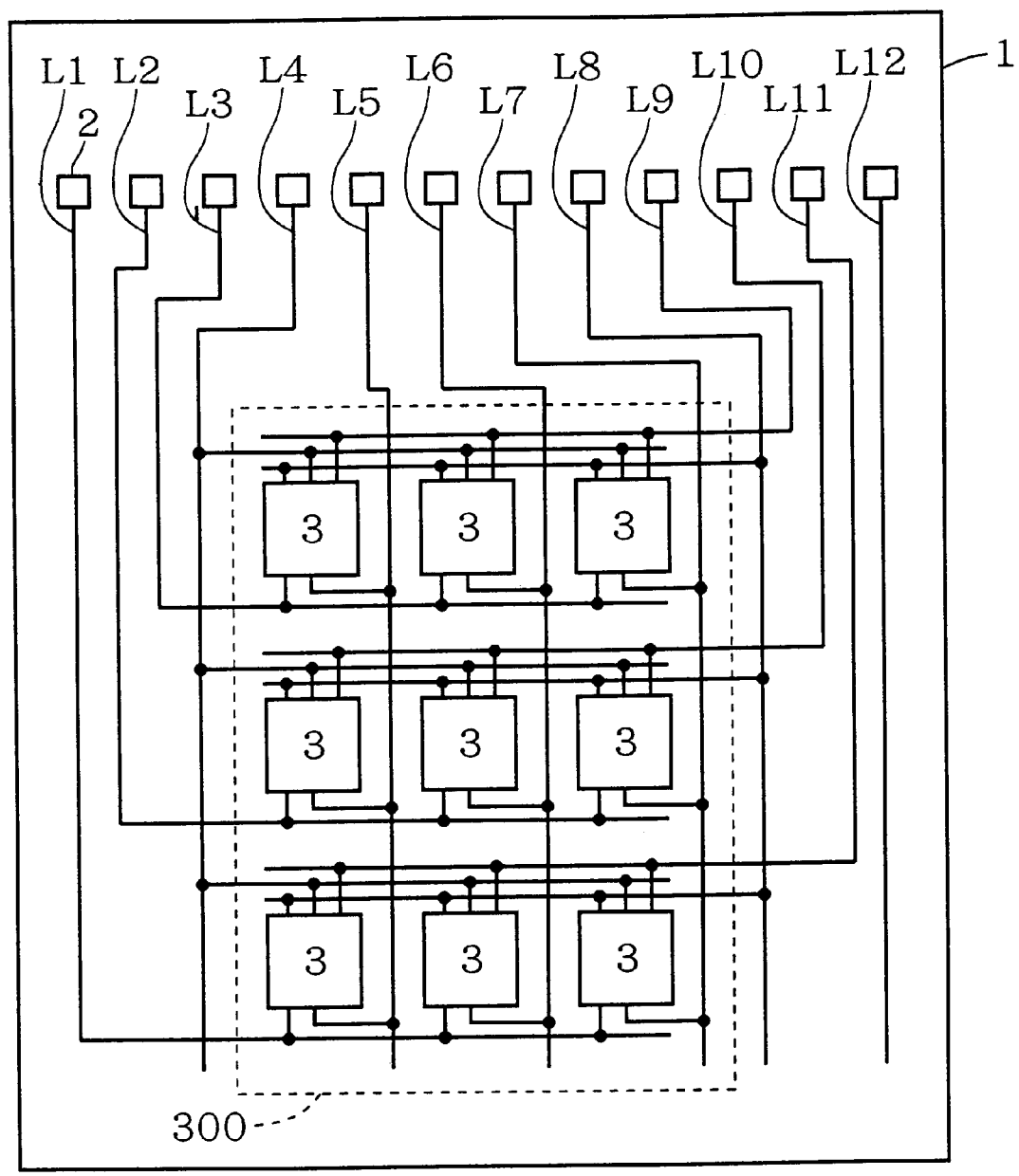
FIG. 18 is a conceptual diagram of a memory cell evaluation semiconductor device according to an embodiment 11 of the present invention.

Referring to FIG. 18, the wires L1 to 13 are connected with P-N junction elements 312, the wire L4 is connected with source electrodes of MOS transistors PT, the wires L5 to L7 are connected with drain electrodes of the MOS transistors PT, the wire L8 is connected with capacitors 311, and the wires L9 to L11 are connected with back-gate electrodes of the MOS transistors PT respectively.

Figure 19:
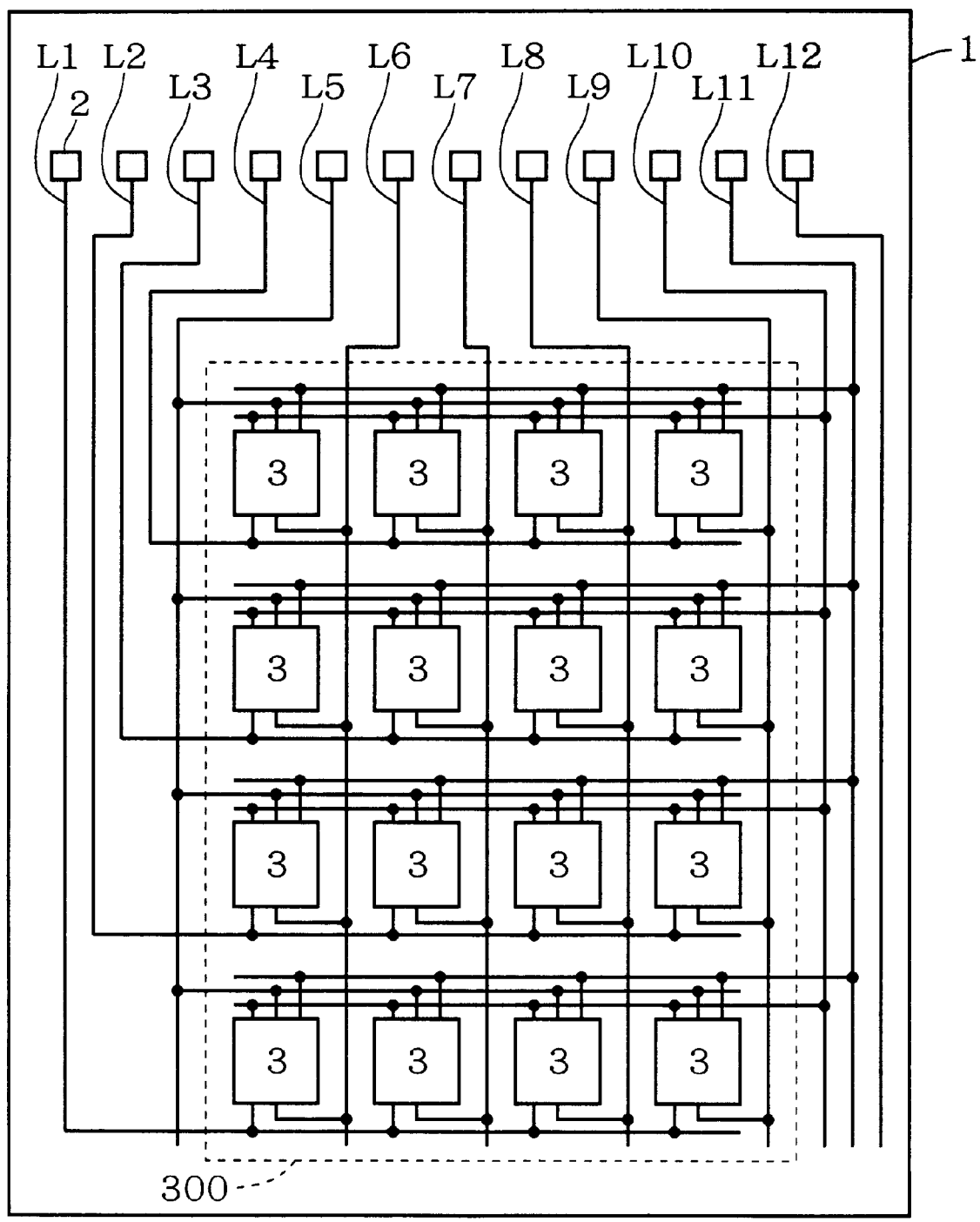
FIG. 19 is a conceptual diagram of another memory cell evaluation semiconductor device according to the embodiment 11 of the present invention.

Referring to FIG. 19, the wires L1 to L4 are connected with P-N junction elements 312, the wire L5 is connected with source electrodes of MOS transistors PT, the wires L6 to L9 are connected with drain electrodes of the MOS transistors PT, the wire L10 is connected with capacitors 311, and the wire L11 is connected with back-gate electrodes of the MOS transistors PT respectively.

Figure 20:
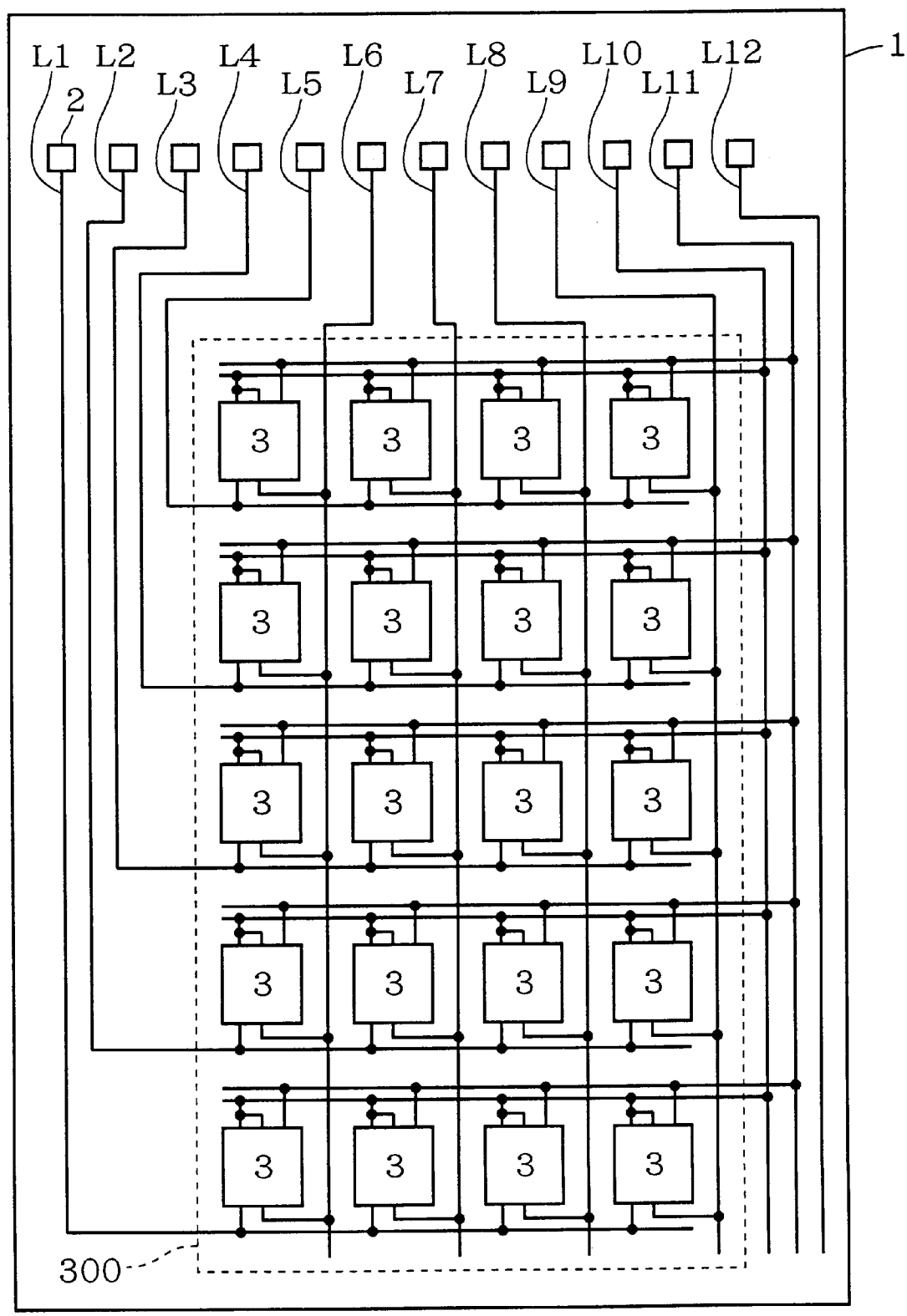
FIG. 20 is a conceptual diagram of still another memory cell evaluation semiconductor device according to the embodiment 11 of the present invention.

Referring to FIG. 20, the wires L1 to L5 are connected with P-N junction elements 312, the wires L6 to L9 are connected with drain electrodes of MOS transistors PT, the wire L10 is connected with source electrodes of the MOS transistors PT and capacitors 311, and the wire L11 is connected with back-gate electrodes of the MOS transistors PT respectively.

Figure 21:
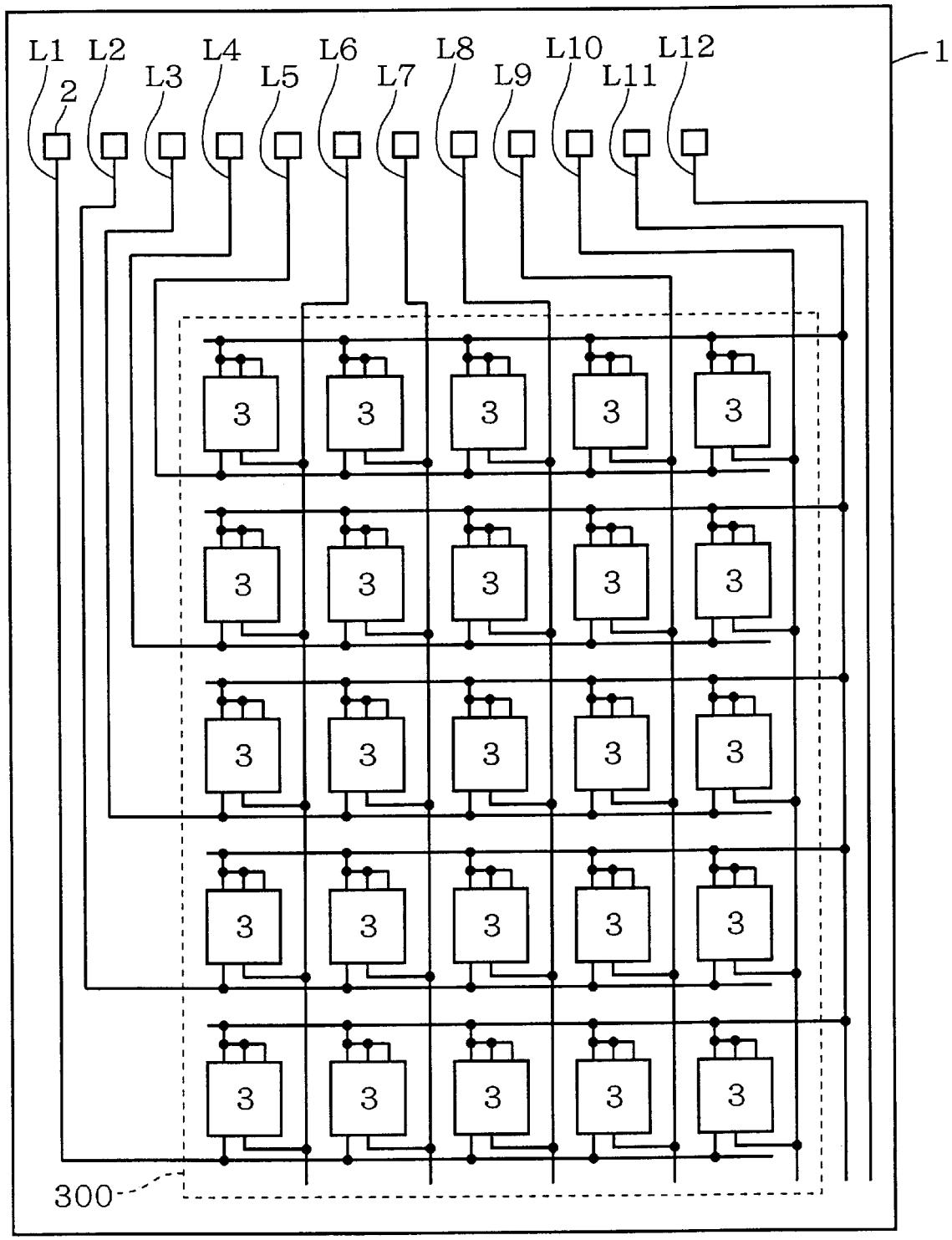
FIG. 21 is a conceptual diagram of a further memory cell evaluation semiconductor device according to the embodiment 11 of the present invention.

Referring to FIG. 21, the wires L1 to L5 are connected with P-N junction elements 312, the wires L6 to L10 are connected with drain electrodes of MOS transistors PT, and the wire L11 is connected with source electrodes and back-gate electrodes of the MOS transistors PT and capacitors 311 respectively.

As hereinabove described, the source electrodes which are outputs of the memory cell evaluation parts 3 provided in the memory cell array 300 are connected with the same pads 2 in the memory cell evaluation semiconductor devices shown in FIGS. 18 to 21.

The operation of each memory cell evaluation semiconductor device is now described. A forward potential is applied to the pads 2 which are connected with the P-N junction elements 312, so that storage node electrodes provided in the memory cell evaluation parts 3 store charges. Currents outputted from all memory cell evaluation parts 3 of the memory cell array 300 concentrate to the pads 2 which are connected with the source electrodes.

The memory cell evaluation parts 3 may not be identical to that according to the embodiment 7. Further, the wires L12 may be omitted if the memory cell evaluation semiconductor devices are provided with no bottom layers BN.

The embodiment 11 of the present invention attains the following effect: Change of the potentials of the storage node electrodes can be statistically evaluated by observing drain currents outputted from the pads 2 which are connected with the source electrodes.

Embodiment 12

Figure 22:
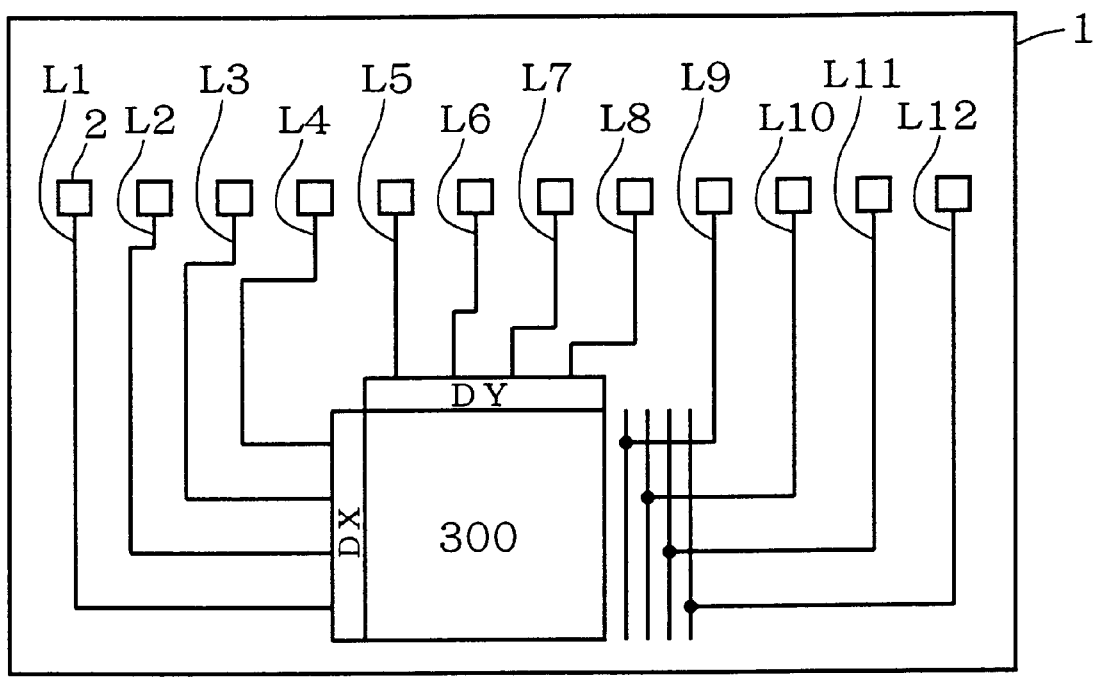
FIG. 22 is a conceptual diagram of a memory cell evaluation semiconductor device according to an embodiment 12 of the present invention.
Figure 23:
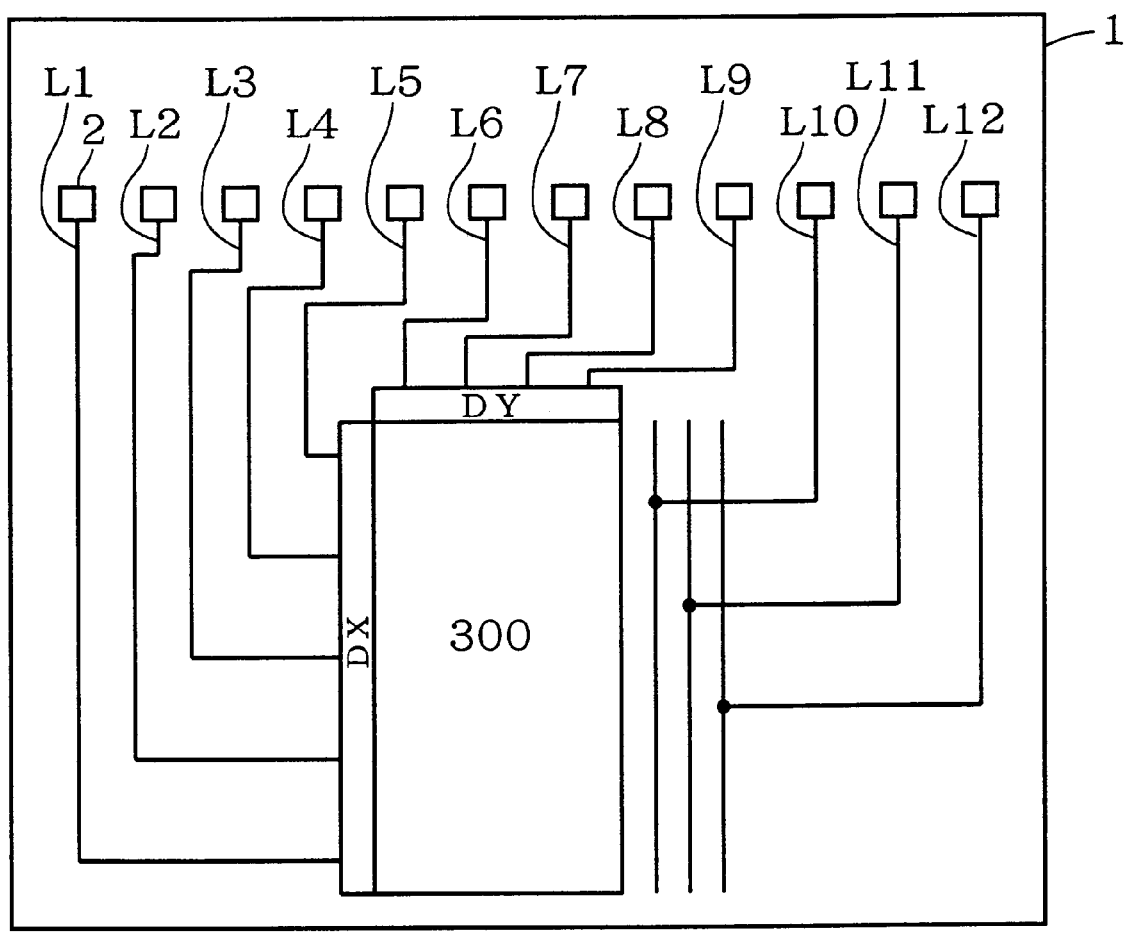
FIG. 23 is a conceptual diagram of another memory cell evaluation semiconductor device according to the embodiment 12 of the present invention.
Figure 24:
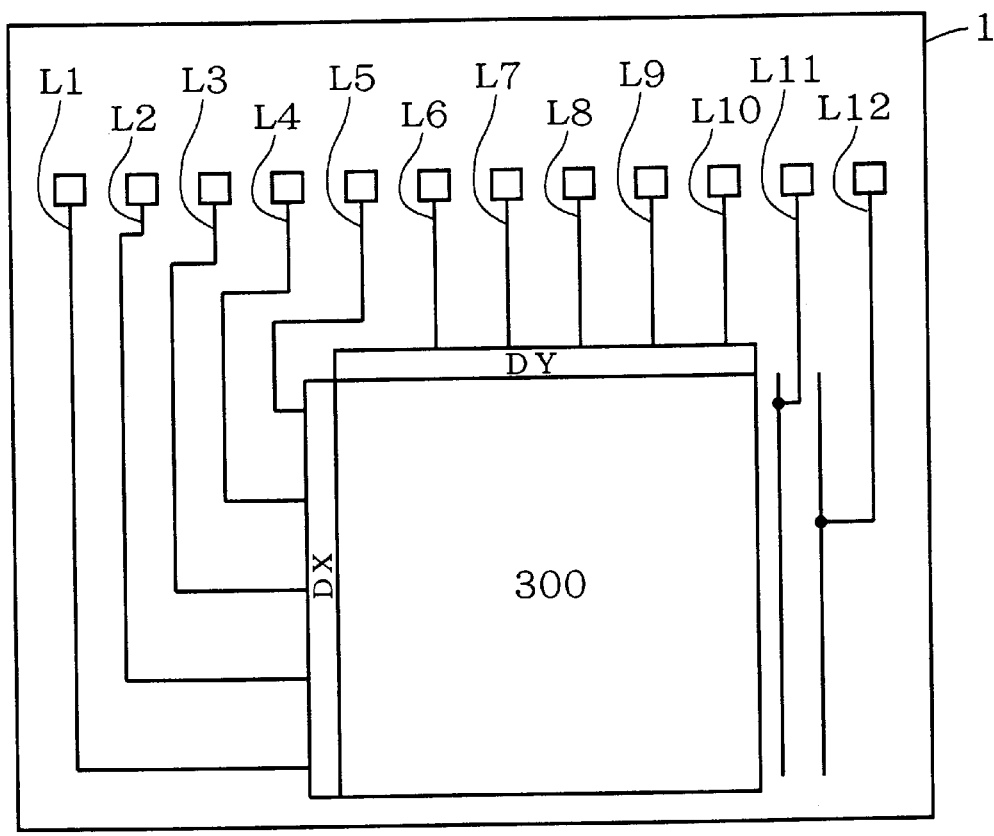
FIG. 24 is a conceptual diagram of still another memory cell evaluation semiconductor device according to the embodiment 12 of the present invention.

FIGS. 22 to 24 are conceptual diagrams of memory cell evaluation semiconductor devices according to an embodiment 12 of the present invention. In each memory cell evaluation semiconductor device according to the embodiment 12 of the present invention, a memory cell array 300 is formed by a larger number of memory cell evaluation parts 3 as compared with each of the memory cell evaluation semiconductor devices shown in FIGS. 18 to 21, while decoders DX and DY are interposed between the memory cell array 300 and pads 2.

Referring to FIG. 22, 256 memory cell evaluation parts 3 of 16 rows by 16 columns are arranged in the memory cell array 300. Wires L1 to L4 are connected with inputs of the decoder DX. Wires L5 to L8 are connected with inputs of the decoder DY. 16 output lines corresponding to the respective rows extend from outputs of the decoder DX, to be connected with P-N junction elements 312 of the respective rows. Further, 16 output lines corresponding to the respective columns extend from outputs of the decoder DY, to be connected with drain electrodes of MOS transistors PT provided in the respective columns. A wire L9 is connected with all capacitors 311 provided in the memory cell array 300. A wire L10 is connected with source electrodes of all MOS transistors PT provided in the memory cell array 300. A wire L11 is connected with back-gate electrodes of all MOS transistors PT provided in the memory cell array 300.

Referring to FIG. 23, 512 memory cell evaluation parts 3 of 32 rows by 16 columns are arranged in the memory cell array 300. Wires L1 to L5 are connected with inputs of the decoder DX. Wires L6 to L9 are connected with inputs of the decoder DY. 32 output lines corresponding to the respective rows extend from outputs of the decoder DX, to be connected with P-N junction elements 312 provided in the respective rows. Further, 16 output lines corresponding to the respective columns extend from outputs of the decoder DY, to be connected with drain electrodes of MOS transistors PT provided in the respective columns. A wire L10 is connected with all capacitors 311 provided in the memory cell array 300 and source electrodes of all MOS transistors PT provided in the memory cell array 300. A wire L11 is connected with back-gate electrodes of all MOS transistors PT provided in the memory cell array.

Referring to FIG. 24, 1024 memory cell evaluation parts 3 of 32 rows by 32 columns are arranged in the memory cell array 300. Wires L1 to L5 are connected with inputs of the decoder DX. Wires L6 to L10 are connected with inputs of the decoder DY. 32 output lines corresponding to the respective rows extend from outputs of the decoder DX, to be connected with P-N junction elements 312 provided in the respective rows. Further, 32 output lines corresponding to the respective columns extend from outputs of the decoder DY, to be connected with drain electrodes of MOS transistors PT provided in the respective columns. A wire L11 is connected with all capacitors 311 provided in the memory cell array 300 and source electrodes and back-gate electrodes of all MOS transistors PT provided in the memory cell array 300. In the memory cell evaluation semiconductor devices shown in FIGS. 22 to 24, as hereinabove described, the source electrodes which are outputs of the memory cell evaluation parts 3 provided in the memory cell arrays 30 are connected to the same pads 2.

The operation of each memory cell evaluation semiconductor device is now described. The decoder DX applies a forward potential to the output lines indicated by address signals which are applied to a plurality of pads 2 connected therewith. Charges are implanted in storage node electrodes provided in the memory cell evaluation parts 3 connected with the output lines to which the forward potential is applied. The decoder DY applies a fixed potential to the output lines indicated by address signals which are applied to a plurality of pads 2 connected therewith, thereby enabling the memory cell evaluation parts 3 connected with the output lines to feed drain currents. Thus, the decoders DX and DY drive the memory cell evaluation parts 3 corresponding to the address signals. Currents outputted from all memory cell evaluation parts 3 provided in the memory cell array 300 concentrate to the pads 2 which are connected with the source electrodes.

The embodiment 12 of the present invention attains the following effect: Even if the number of the pads 2 formable on a p-type semiconductor substrate 1 is limited, a larger number of memory cell evaluation parts 3 can be formed as compared with the embodiment 11, due to the provision of the decoders DX and DY.

Embodiment 13

A method of fabricating the memory cell evaluation semiconductor device shown in FIG. 4 according to an embodiment 13 of the present invention is now described with reference to FIGS. 25 to 35.

Figure 25:
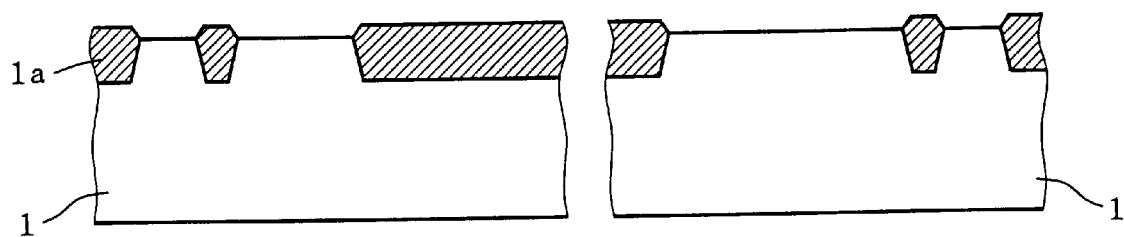
FIG. 25 is an explanatory diagram showing a method of fabricating a memory cell evaluation semiconductor device according to an embodiment 13 of the present invention.

First, an element isolation film 1a of a LOCOS structure having a thickness of 0.3 to 0.5 $\mu$m is formed on a p-type semiconductor substrate 1 (FIG. 25).

Figure 26:
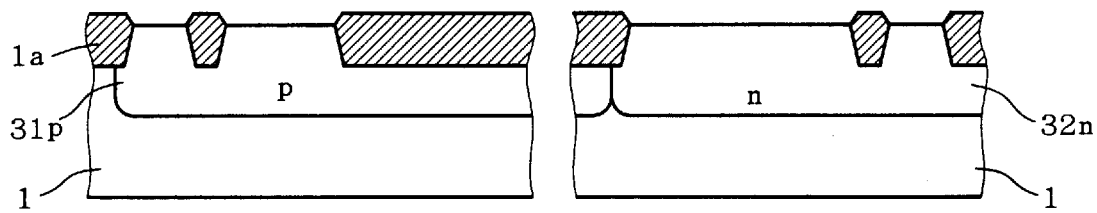
FIG. 26 is an explanatory diagram showing the method of fabricating a memory cell evaluation semiconductor device according to the embodiment 13 of the present invention.

Then, boron (B) having energy of 0.3 to 1.5MeV is implanted into a region for forming a dummy cell part 31, thereby forming a p-type well region 31p having an impurity concentration of $10^{12}$ to $10^{14}/cm^2$. Further, phosphorus (P) having energy of 0.5 to 3.0 MeV is implanted into a region for forming a sense part 32, thereby forming an n-type well region 32n having an impurity concentration of $10^{12}$ to $10^{14}/cm^2$ (FIG. 26).

Figure 27:
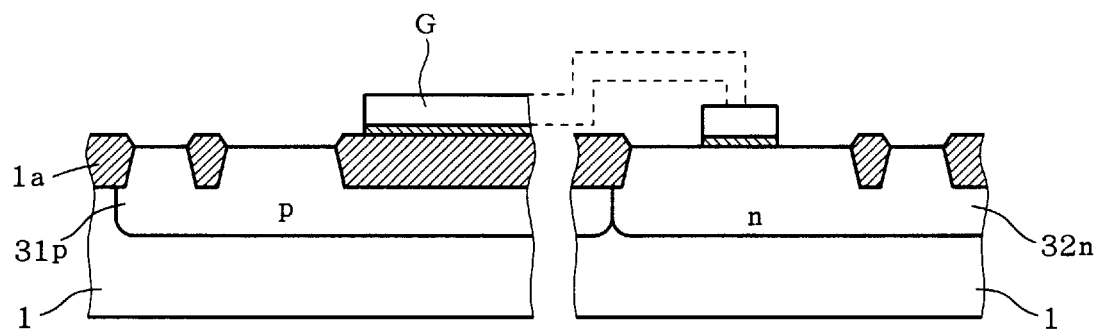
FIG. 27 is an explanatory diagram showing the method of fabricating a memory cell evaluation semiconductor device according to the embodiment 13 of the present invention.

Then, a gate electrode G of d-αpoly having a thickness of 0.2 $\mu$m is formed to extend from a portion on the element isolation film 1a located between the p-type well region 31p and the n-type well region 32n onto the n-type well region 32n (FIG. 27).

Figure 28:
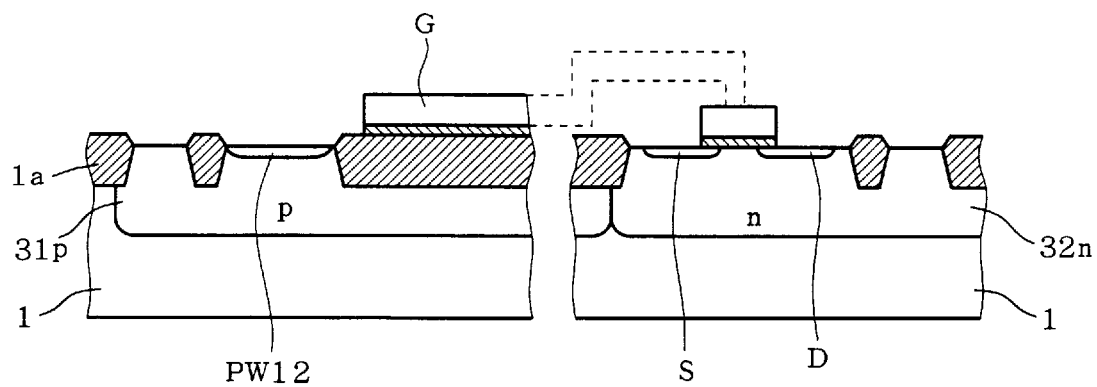
FIG. 28 is an explanatory diagram showing the method of fabricating a memory cell evaluation semiconductor device according to the embodiment 13 of the present invention.

Then, phosphorus (P) having energy of 0.01 to 0.05 MeV or arsenic (As) having energy of 0.03 to 0.15 MeV is implanted into the p-type well region 31p and the n-type well region 32n through the element isolation film 1a and the gate electrode G serving as masks, thereby forming an electrode PW12 having an impurity concentration of $5\times10^{12}$ to $10^{14}/cm^2$, a source electrode S and a drain electrode D (FIG. 28).

Figure 29:
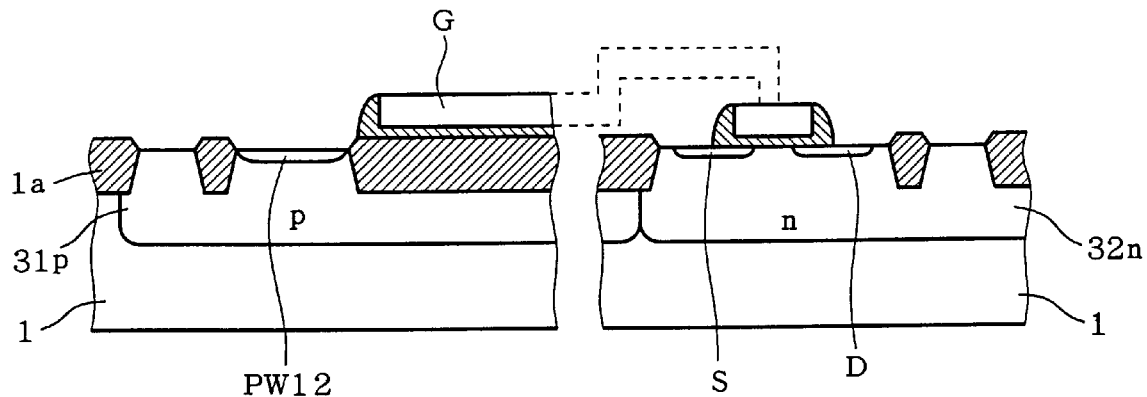
FIG. 29 is an explanatory diagram showing the method of fabricating a memory cell evaluation semiconductor device according to the embodiment 13 of the present invention.

Then, side walls of TEOS having a thickness of 0.05 to 0.3 $\mu$m are formed on side surfaces of the gate electrode G (FIG. 29).

Figure 30:
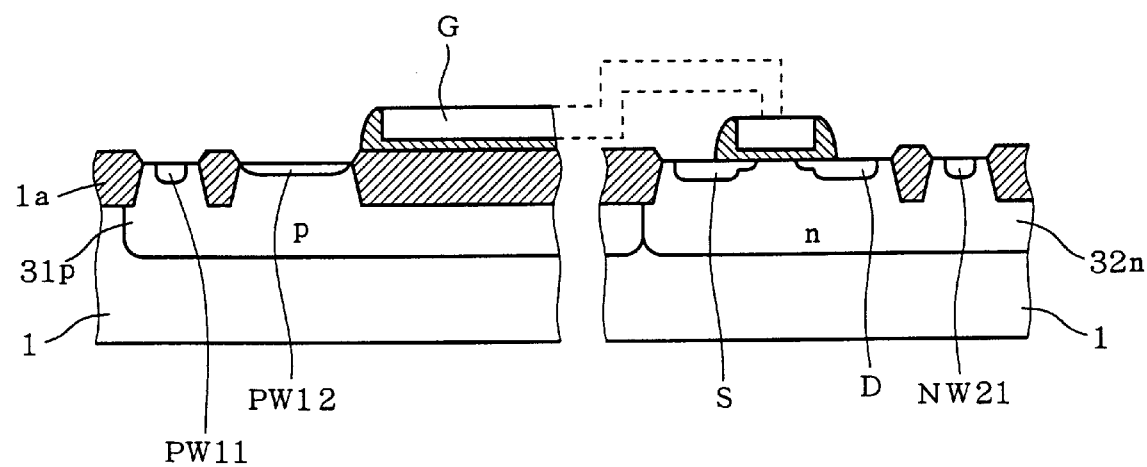
FIG. 30 is an explanatory diagram showing the method of fabricating a memory cell evaluation semiconductor device according to the embodiment 13 of the present invention.

Then, boron fluoride (BF$_2$) having energy of 0.01 to 0.05 MeV is implanted into the p-type well region 31p, the source electrode S and the drain electrode D, thereby forming an electrode PW11 having an impurity concentration of $5\times10^{14}$ to $10^{16}/cm^2$ while bringing the source electrode S and the drain electrode D into LDD structures. Further, phosphorus (P) having energy of 0.01 to 0.05 MeV is implanted into the n-type well region 32n, thereby forming a back-gate electrode NW21 having an impurity concentration of $5 \times 10^{14}$ to $10^{16}/cm^2$ (FIG. 30).

Figure 31:
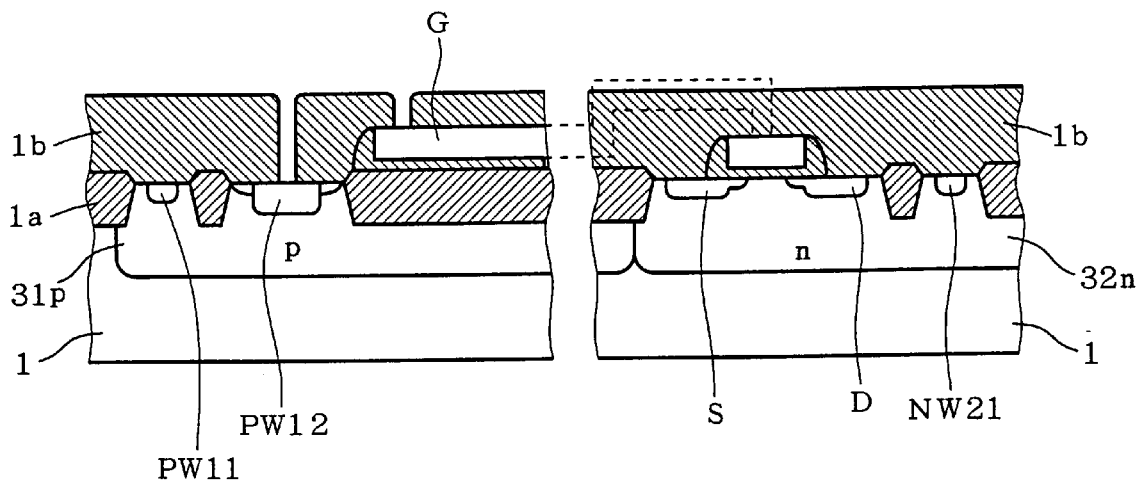
FIG. 31 is an explanatory diagram showing the method of fabricating a memory cell evaluation semiconductor device according to the embodiment 13 of the present invention.

Then, an interlayer isolation film 1b of TEOS having a thickness of 0.3 to 1.0 μm is formed on the overall surface. Storage contact holes are formed in the interlayer isolation film 1b, to expose the gate electrode G and the electrode PW12 on the element isolation film 1a between the p-type well region 31p and the n-type well region 32n. Phosphorus (p) having energy of 0.05 to 0.3 MeV is implanted into the electrode PW12, thereby forming a region having a concentration of $5 \times 10^{12}$ to $10^{14}/cm^2$ in the electrode PW12 (FIG. 31).

Figure 32:
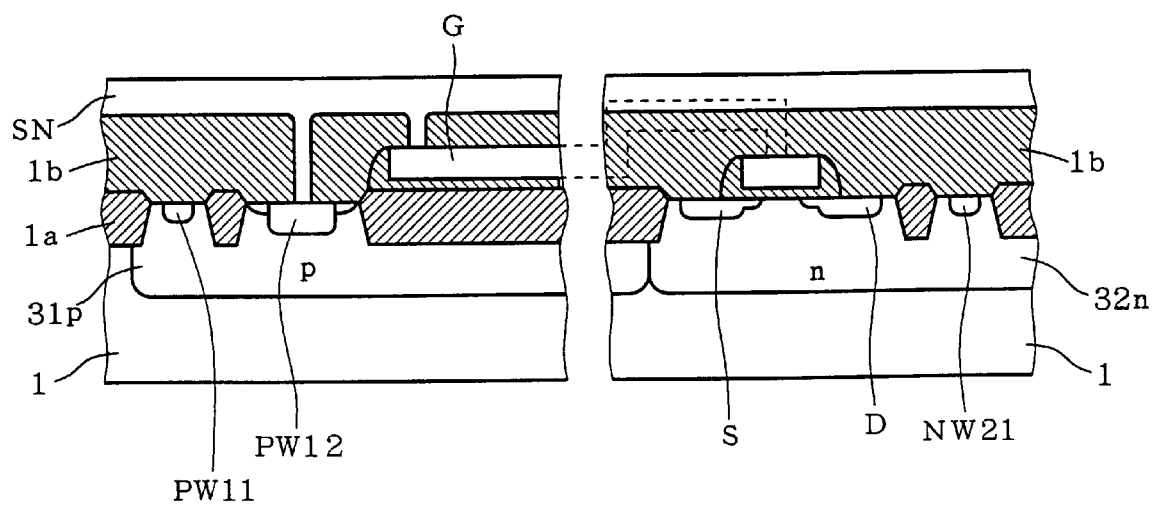
FIG. 32 is an explanatory diagram showing the method of fabricating a memory cell evaluation semiconductor device according to the embodiment 13 of the present invention.

Then, a storage node electrode SN of d-αpoly having a thickness of 0.1 to 0.3 μm is formed on the overall surface. Then, phosphorus (P) having energy of 0.05 to 0.3 MeV is implanted into the storage node electrode SN (FIG. 32).

Figure 33:
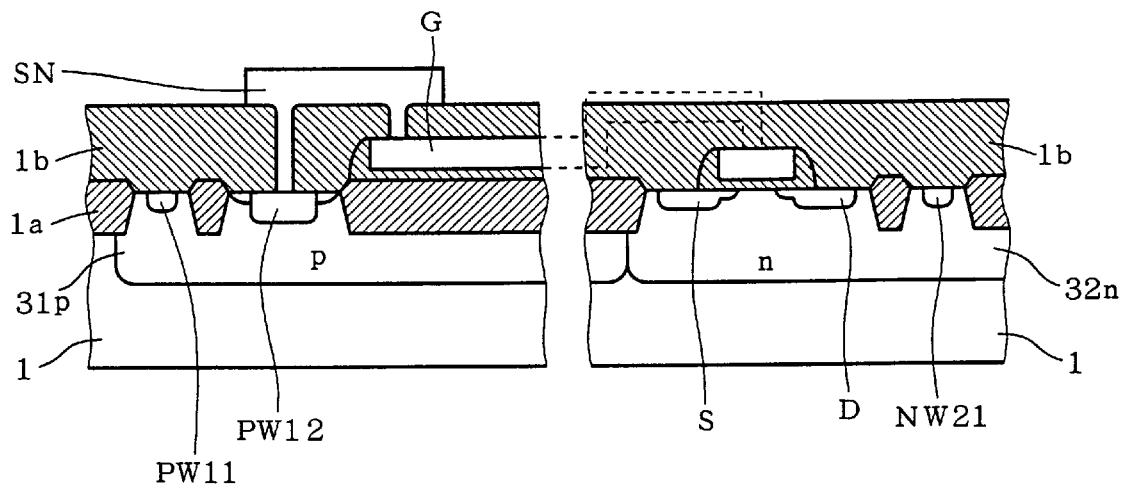
FIG. 33 is an explanatory diagram showing the method of fabricating a memory cell evaluation semiconductor device according to the embodiment 13 of the present invention.

Then, the storage node electrode SN is shaped through a resist mask (not shown) (FIG. 33).

Figure 34:
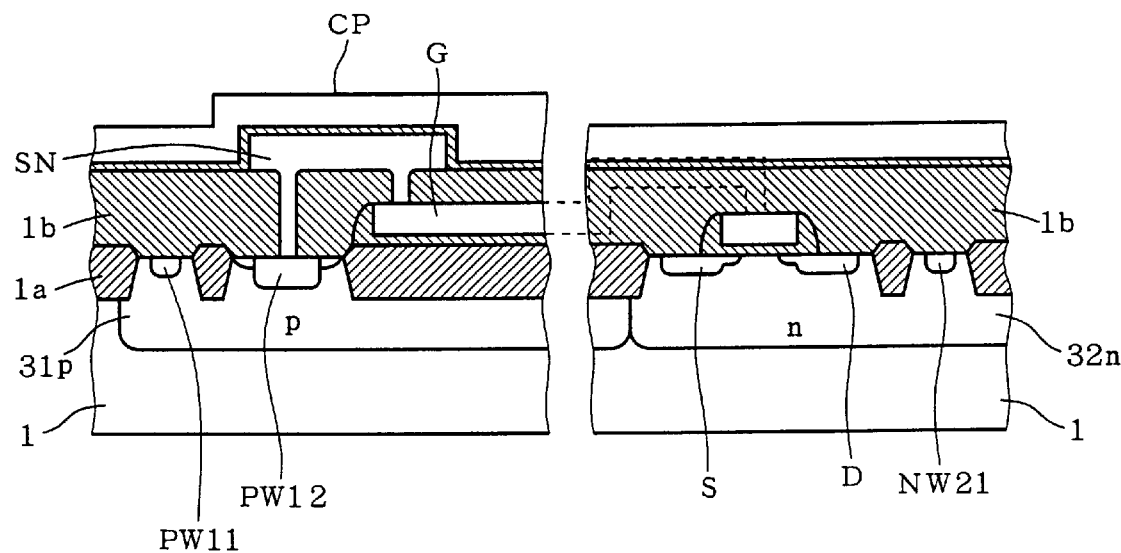
FIG. 34 is an explanatory diagram showing the method of fabricating a memory cell evaluation semiconductor device according to the embodiment 13 of the present invention.

Then, a dielectric film of $SiO_2$ or $Si_3N_4$ having a thickness of 0.01 to 0.03 μm is formed on the overall surface. A counter electrode CP of interpoly having a thickness of 0.1 to 0.3 μm is formed on the dielectric film (FIG. 34).

Figure 35:
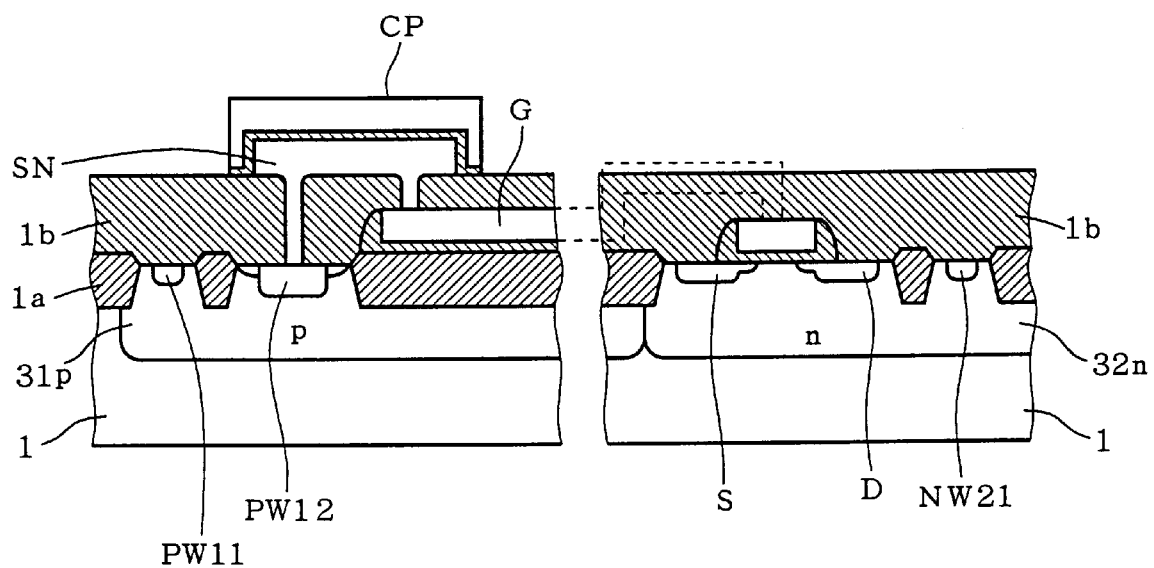
FIG. 35 is an explanatory diagram showing the method of fabricating a memory cell evaluation semiconductor device according to the embodiment 13 of the present invention.

Then, the dielectric film and the counter electrode CP are shaped through a resist mask (FIG. 35).

Then, an interlayer isolation film 1c of BPTEOS having a thickness of 1.0 μm is formed. Then, an aluminum wire AL of AlCu having a thickness of 0.5 to 1.0 μm is formed. Then, pads 2 are formed. Then, a passivation film 1d of $Si_3N_4$ having a thickness of 0.3 to 1.0 μm is formed, thereby completing the memory cell evaluation semiconductor device shown in FIG. 4.

Embodiment 14

Figure 37:
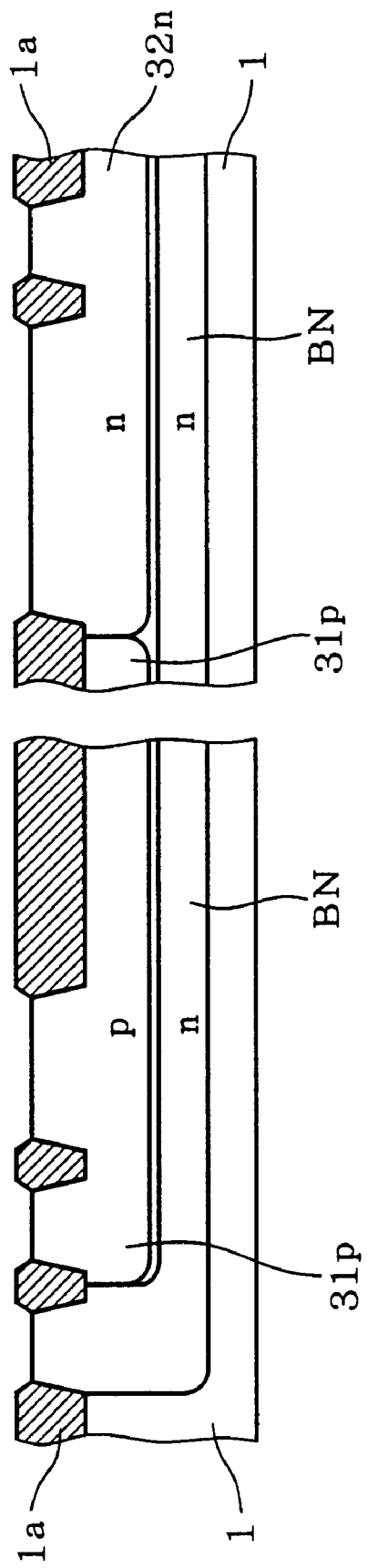
FIG. 37 is an explanatory diagram showing the method of fabricating a memory cell evaluation semiconductor device according to the embodiment 14 of the present invention.
Figure 38:
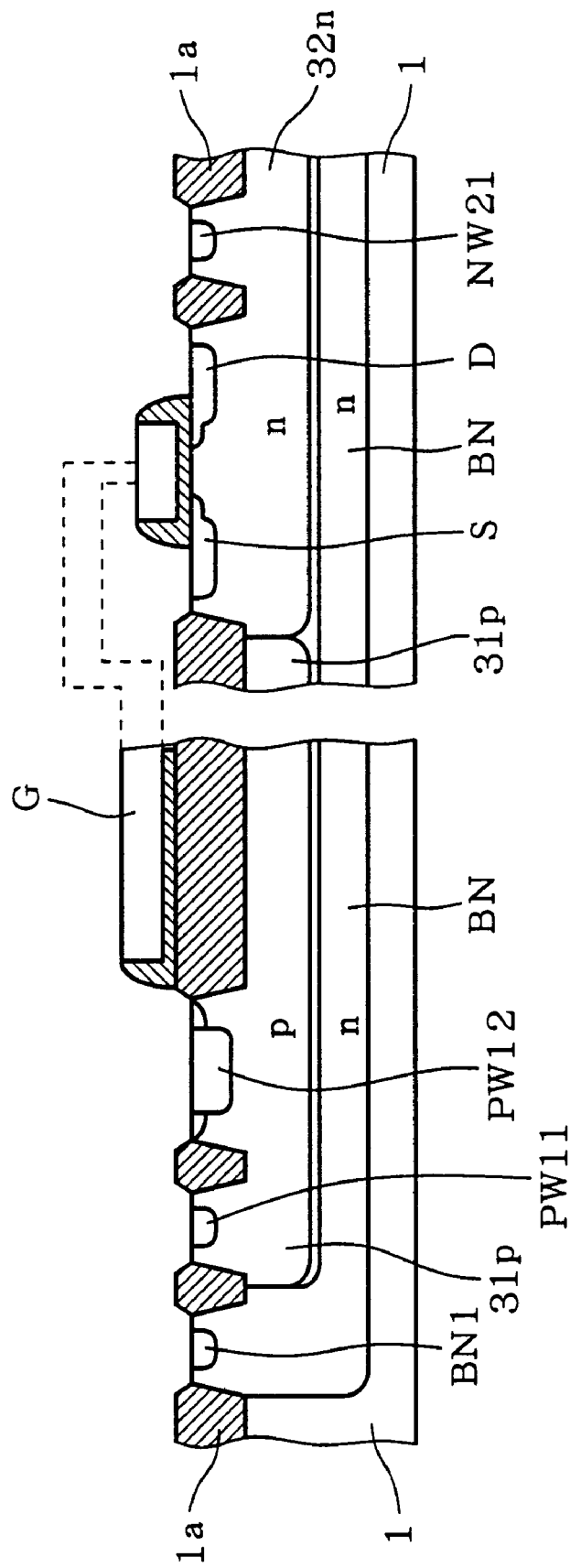
FIG. 38 is an explanatory diagram showing the method of fabricating a memory cell evaluation semiconductor device according to the embodiment 14 of the present invention.

A method of fabricating the memory cell evaluation semiconductor device shown in FIG. 14 according to an embodiment 14 of the present invention is now described with reference to FIGS. 36 to 38.

Figure 36:
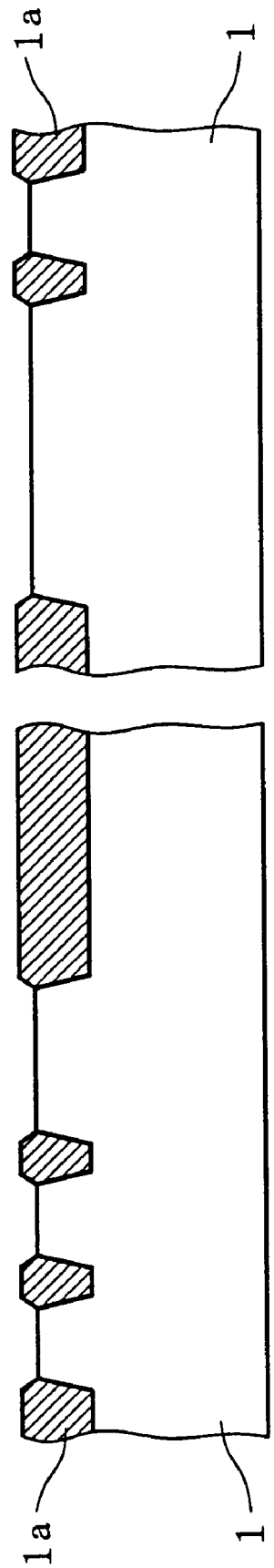
FIG. 36 is an explanatory diagram showing a method of fabricating a memory cell evaluation semiconductor device according to an embodiment 14 of the present invention.

First, an element isolation film 1a of a LOCOS structure having a thickness of 0.3 to 0.5 μm is formed on a p-type semiconductor substrate 1 (FIG. 36).

Then, phosphorus (P) having energy of 1.0 to 3.0 MeV is implanted, thereby forming a bottom layer BN having an impurity concentration of $10^{12}$ to $10^{14}/cm^2$ in a deep position of the p-type semiconductor substrate 1. Then, boron (B) having energy of 0.3 to 1.5 MeV is implanted into a region for forming a dummy cell part 31, thereby forming a p-type well region 31p having an impurity concentration of $10^{12}$ to $10^{14}/cm^2$. Further, phosphorus (P) having energy of 0.5 to 3.0 MeV is implanted into a region for forming a sense part 32, thereby forming an n-type well region 32n having an impurity concentration of $10^{12}$ to $10^{14}/cm^2$ (FIG. 37).

Thereafter steps similar to those of the embodiment 13 described with reference to FIGS. 27 to 29 are carried out.

Then, boron fluoride ($BF_2$) having energy of 0.01 to 0.05 MeV is implanted into the p-type well region 31p, a source electrode S and a drain electrode D, thereby forming an electrode PW11 having an impurity concentration of $5 \times 10^{14}$ to $10^{16}/cm^2$ while bringing the source electrode S and the drain electrode D into LDD structures. Further, phosphorus (P) having energy of 0.01 to 0.05 MeV is implanted into the n-type well region 32n and the bottom layer BN, thereby forming a back-gate electrode NW21 having an impurity concentration of $5 \times 10^{14}$ to $10^{16}/cm^2$ and an electrode BN1 (FIG. 38).

Thereafter steps similar to those of the embodiment 13 shown in FIGS. 31 to 35 are carried out for forming an interlayer isolation film 1c, an aluminum wire AL, pads 2 and a passivation film 1d, thereby completing the memory cell evaluation semiconductor device shown in FIG. 14.

Embodiment 15

A memory cell evaluation method according to an embodiment 15 of the present invention with the memory cell evaluation semiconductor device shown in FIG. 2 is now described.

Figure 39:
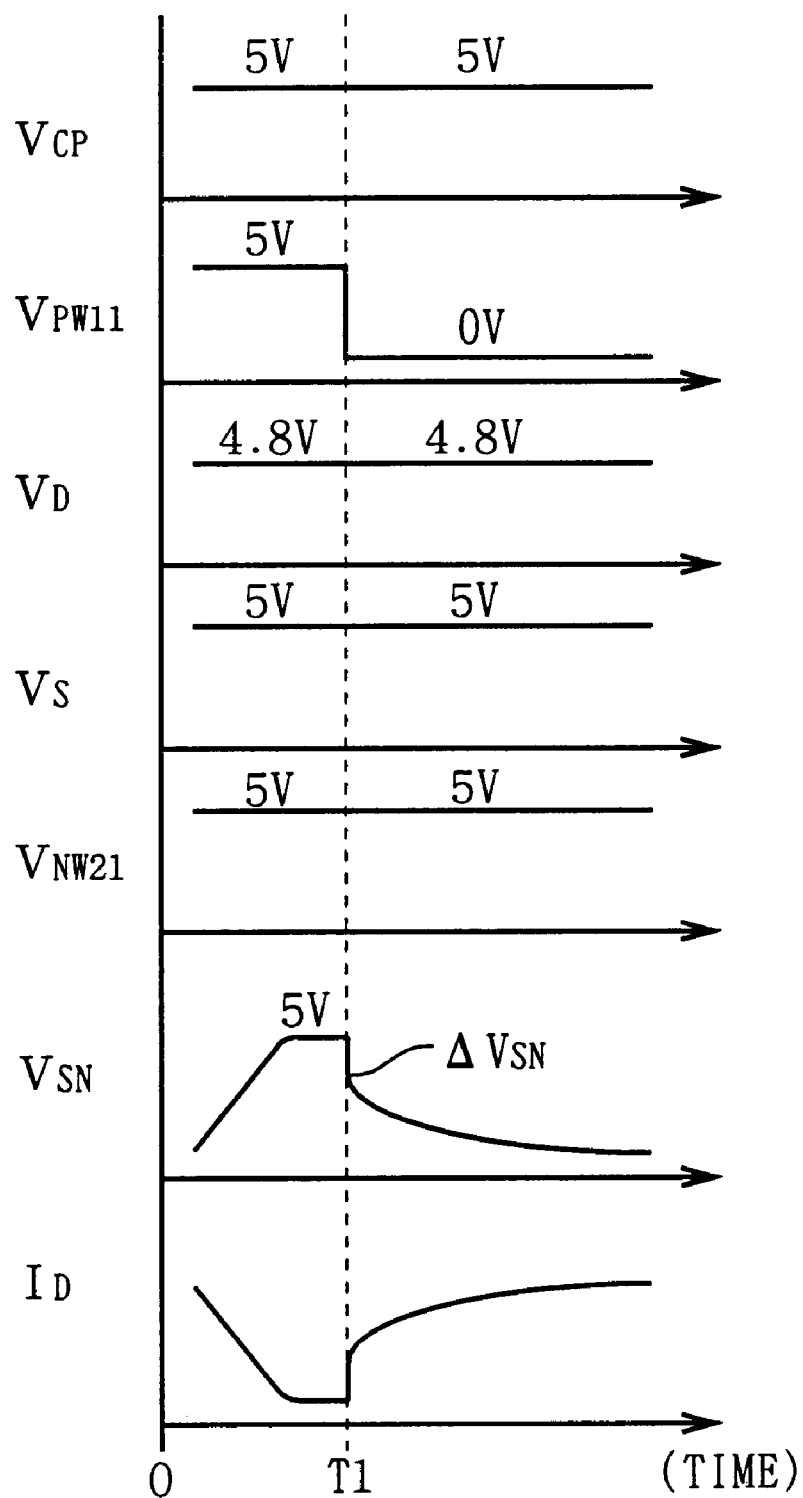
FIG. 39 is a timing chart for illustrating a memory cell evaluation method according to an embodiment 15 of the present invention.

FIG. 39 is a timing chart showing signals in the respective parts of the memory cell evaluation semiconductor device shown in FIG. 2. Referring to FIG. 39, symbols VCP, VPW11, VD, VS and VNW21 denote potentials which are supplied to the pads 2 connected with the capacitor 311, the P-N junction element 312, and the drain electrode, the source electrode and the back-gate electrode of the MOS transistor PT respectively, symbol VSN denotes the potential at the storage node electrode SN, and symbol ID denotes a drain current flowing from the pad 2 which is connected with the drain electrode of the MOS transistor PT.

First, the memory cell evaluation semiconductor device is set on a tester. The tester supplies the potentials VCP, VPW11, VD, VS and VNW21 to the respective pads 2, and observes and records the drain current ID.

At a time 0 in FIG. 39, the tester supplies the pads 2 with the potentials VCP, VPW11, VS and VNW21 of 5 V, which is a power supply voltage for the object of evaluation as well as a forward current of the P-N junction element 312, and the potential VD of 4.8 V. Then, the drain current ID observed by the tester gradually reduces to zero, since the storage node electrode SN stores charges to turn off the MOS transistor PT.

Then, the tester confirms that the drain current ID is zero at a time T1, and supplies the potential VPW11 of 0 V, which is the reverse potential of the P-N junction element 312, to the pad 2.

Figure 40:
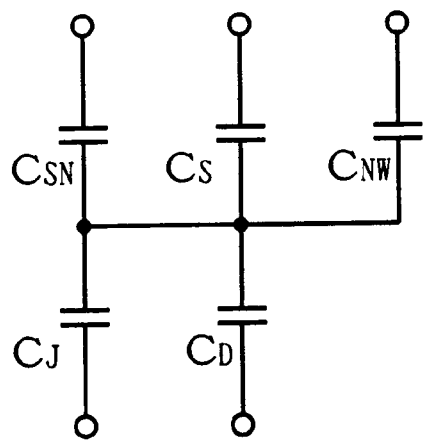
FIG. 40 illustrates a parasitic capacitance of the memory cell evaluation semiconductor device according to the present invention.
Figure 41:
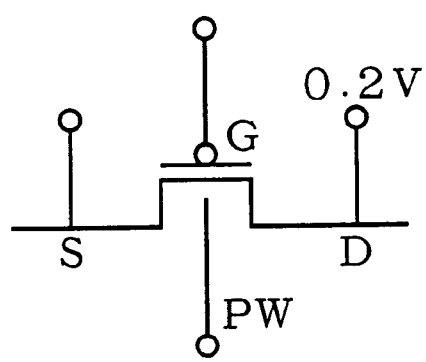
FIG. 41 is an explanatory diagram of the memory cell evaluation method according to the embodiment 15 of the present invention.

The drain current ID observed by the tester instantaneously increases at the time T1 and thereafter gradually increases. The capacitances of respective parts of the memory cell evaluation part 3 shown in FIG. 40 influence the instantaneous increase of the drain current ID. Referring to FIG. 40, symbols CSN, CJ, CS, CD and CG denote capacitances of the capacitor 311, the P-N junction element 312, and the source, the drain and the gate of the MOS transistor PT respectively. It is known that the following storage node potential ΔVSN is caused at the time T1:

$$\Delta VSN = -CJ \times \Delta VPW11/(CSN+CJ+CD+CS+CG)$$

The parasitic capacitances CD, CS and CG can be reduced by reducing the potential differences between the potentials VS, VD and VNW21, for suppressing influence by these parasitic capacitances CD, CS and CG. In case of supplying the potentials shown in FIG. 39, the potential differences between the source electrode S, the drain electrode D and the potential VNW21 are small with the maximum value of 0.2.

Figure 42:
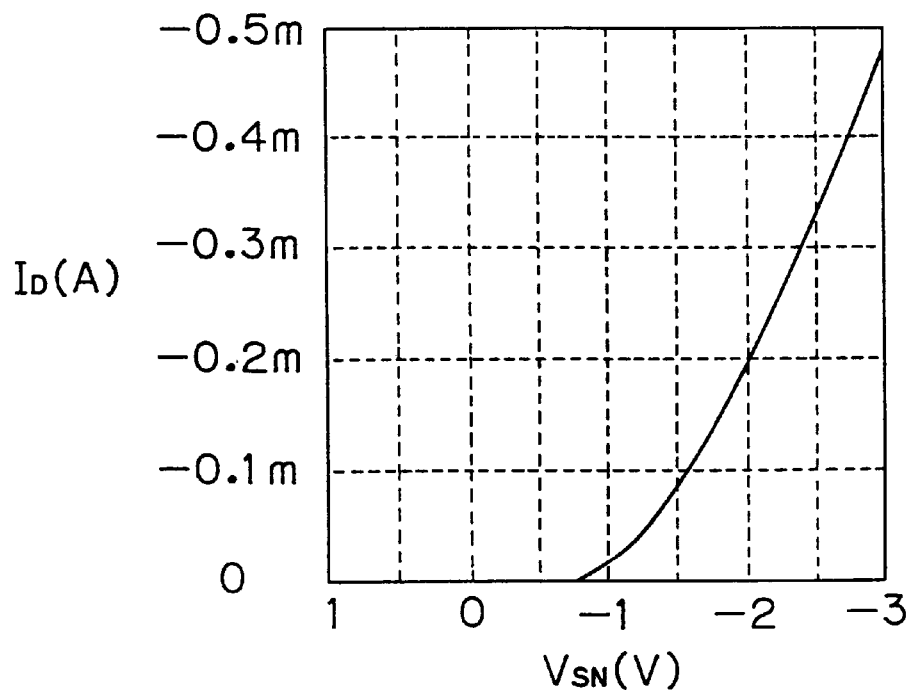
FIG. 42 is a graph showing a gate voltage-to-drain current characteristic.
Figure 43:
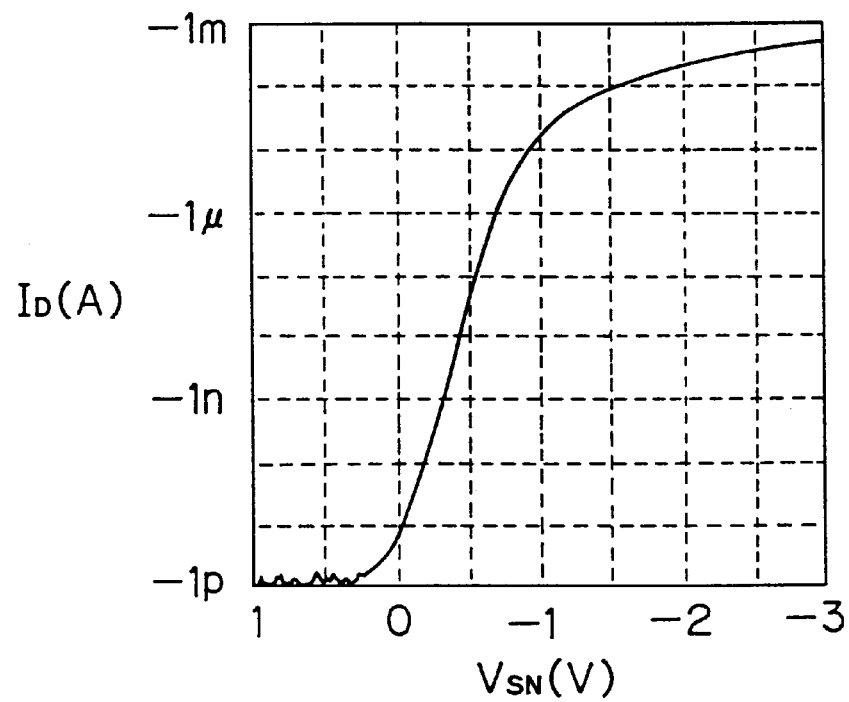
FIG. 43 is a graph showing a gate voltage-to-drain current characteristic.

Then, the tester compares this record with gate voltage (VSN)-to-drain current (ID) characteristics shown in FIGS. 42 and 43 stored in a memory device provided therein, thereby obtaining the potential VSN. This gate voltage is based on the potential VNW21. FIG. 39 shows the potential VSN.

A region where a gate voltage and a drain current are proportional to each other is called a linear region. Referring to each of FIGS. 42 and 43, the gate voltage is not more than −1.5 V in the linear region. The remaining region is called a saturated region.

The time T1 is included in the saturated region since the gate voltage (VSN–VNW21) is zero. However, an error is caused in the potential VSN by instantaneous increase of the drain current ID around the time T1, and hence it is preferable to employ not the saturated region but the linear region.

The embodiment 15 of the present invention attains the following effect: After implanting charges into the storage node electrode SN, the tester reduces the potential VPW11 and observes and records the drain current ID. The potential VSN can be obtained by comparing this record with the gate voltage-to-drain current characteristic.

Embodiment 16

A memory cell evaluation method according to an embodiment 16 of the present invention with the memory cell evaluation semiconductor device shown in FIG. 2 is now described.

As shown in FIG. 43, the drain current ID exponentially increases with respect to the potential VSN. Therefore, the drain current ID remarkably changes with respect to small change of the potential VSN. In a region (linear region) where the potential VSN is smaller than −1 V, on the other hand, the drain current ID increases in proportion to the potential VSN. In the linear region, therefore, it is difficult to detect small change of the potential VSN by the drain current ID as compared with a saturated region.

The curve shown in FIG. 43 moves along the horizontal axis in response to potential difference (=VB) between the source electrode and the back-gate electrode.

Figure 44:
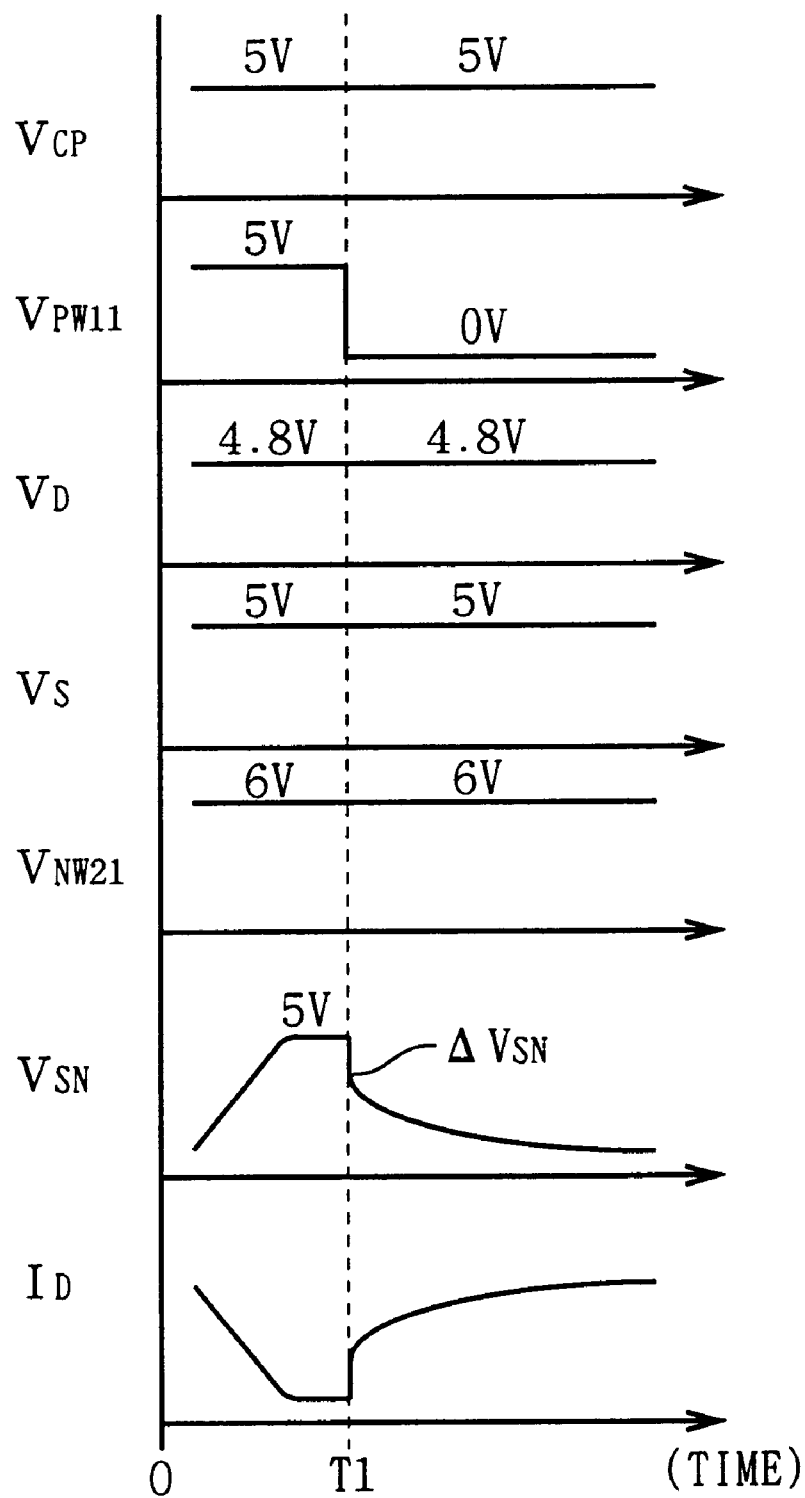
FIG. 44 is a timing chart for illustrating a memory cell evaluation method according to an embodiment 16 of the present invention.
Figure 45:
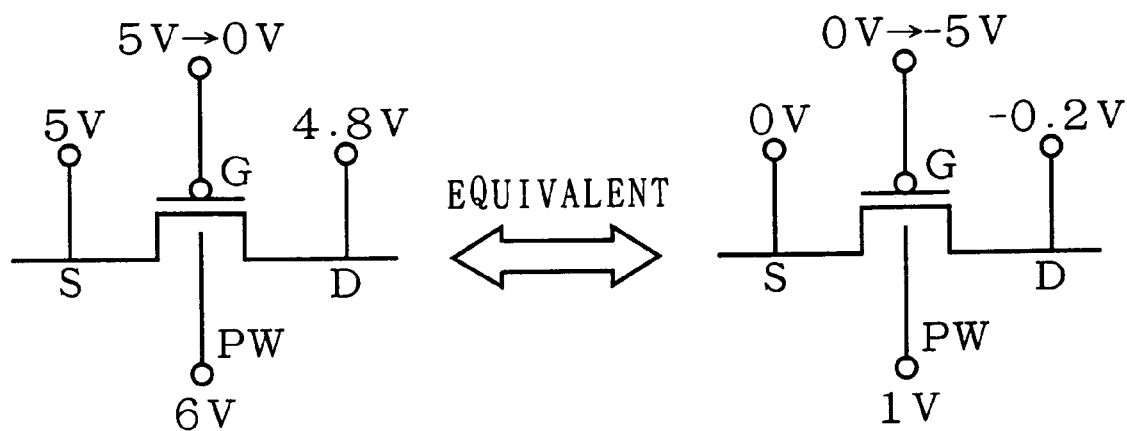
FIG. 45 is an explanatory diagram of the memory cell evaluation method according to the embodiment 16 of the present invention.
Figure 46:
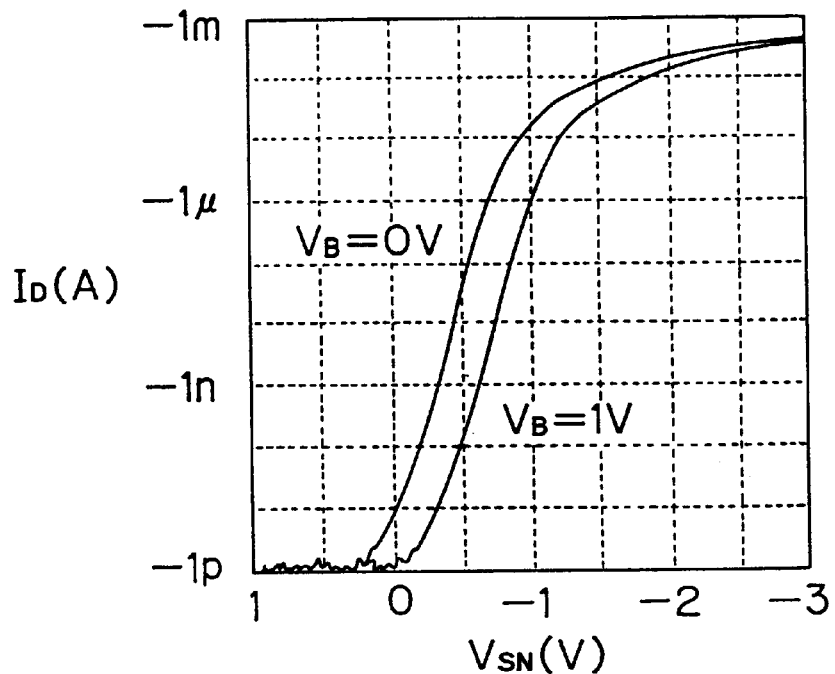
FIG. 46 is a graph showing a gate voltage-to-drain current characteristic.

For example, a tester observes the drain current ID while setting the potential VNW21 at 6 V which is higher than a forward potential of 5 V as shown in FIG. 44 and setting the remaining potentials at levels similar to those in the embodiment 15. As shown in FIG. 45, the potential VPW11 (VB) is 1 V with reference to the source. If the potential difference VB is 1 V, the curve shifts by about 0.5 V as compared with that exhibiting potential difference VB of 0 V, as shown in FIG. 46. In the curve with the potential difference VB of 1 V, therefore, sensitivity is improved around −1.5 V, for example, as compared with the curve exhibiting the potential difference VB of 0 V.

The embodiment 16 of the present invention attains the following effects: The sensitivity of the MOS transistor PT can be adjusted by changing the potential VNW21. Further, the saturated region shifts to a direction for improving the sensitivity, as shown in FIG. 46.

Embodiment 17

A memory cell evaluation method according to an embodiment 17 of the present invention with the memory cell evaluation semiconductor device shown in FIG. 2 is now described.

Figure 47:
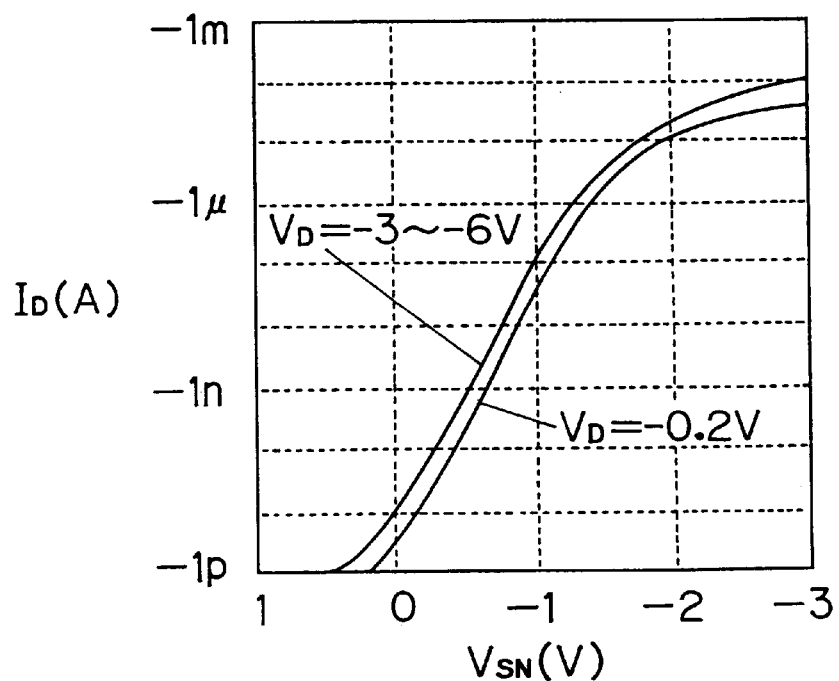
FIG. 47 is a graph showing a gate voltage-to-drain current characteristic.
Figure 48:
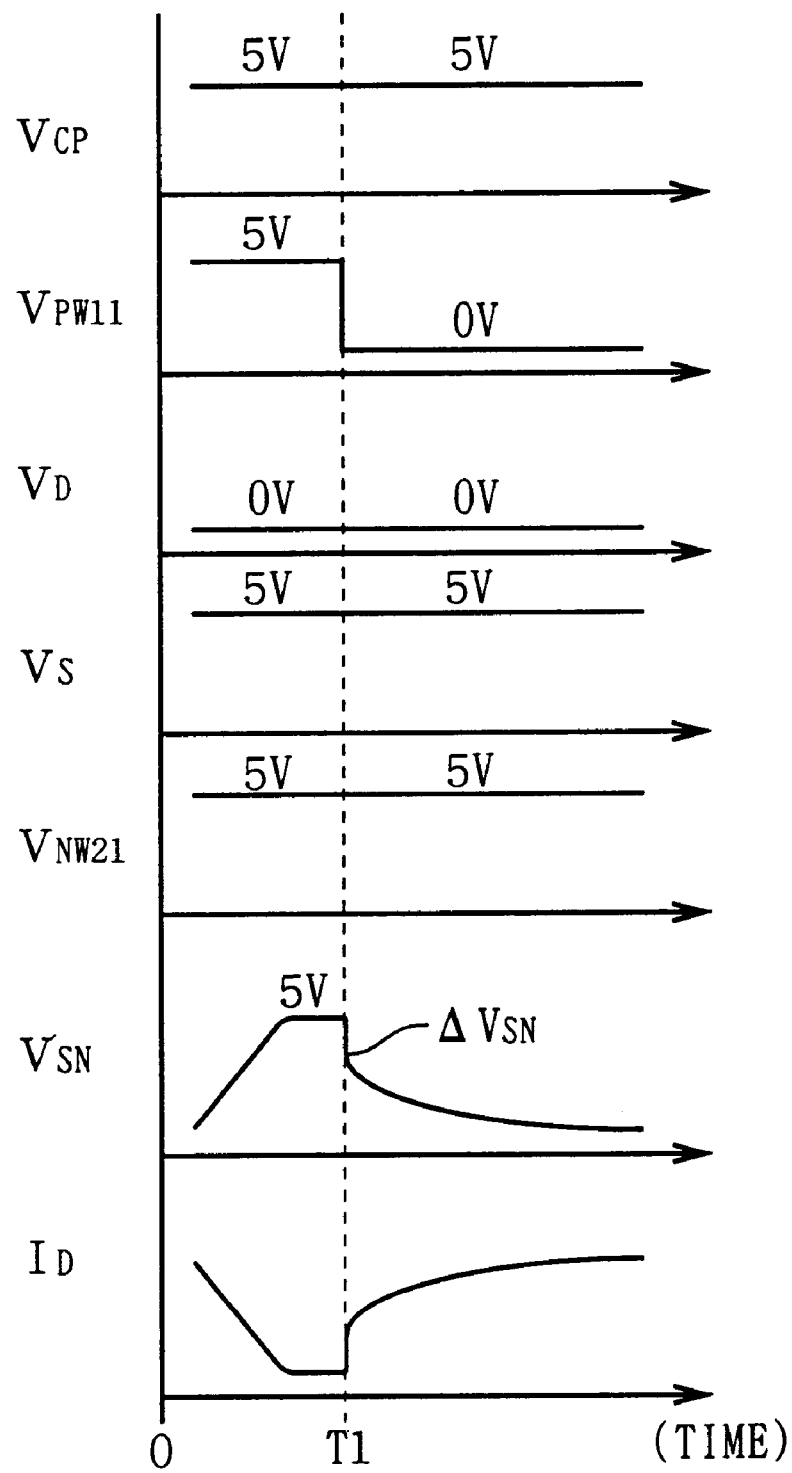
FIG. 48 is a timing chart for illustrating a memory cell evaluation method according to an embodiment 17 of the present invention.
Figure 49:
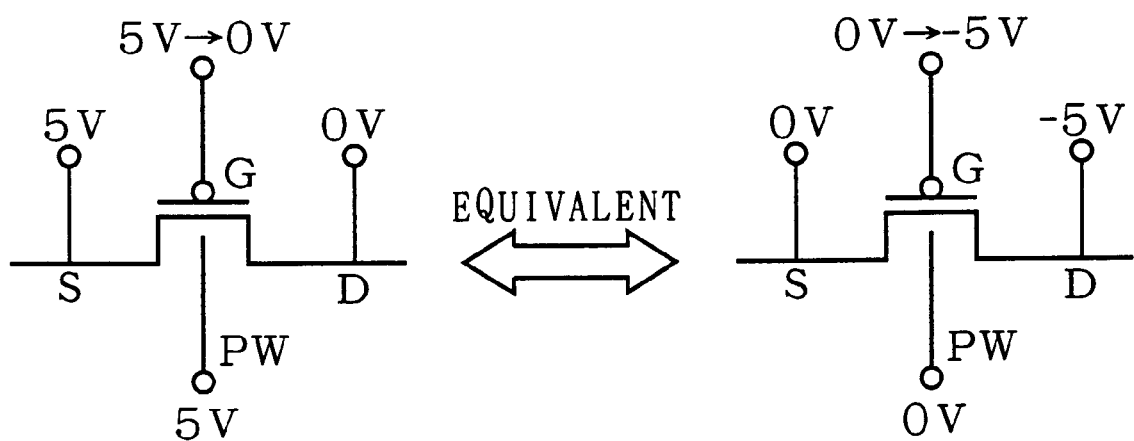
FIG. 49 is an explanatory diagram of the memory cell evaluation method according to the embodiment 17 of the present invention.

In general, a voltage outputted from a tester deviates from a potential applied to an electrode of an element in practice, due to a capacitance or resistance of a measurer itself. In particular, the potential at a pad 2 to which a drain current ID flows is not constant but may fluctuate within a small range. FIG. 47 shows a gate voltage-to-drain current characteristic with a parameter of a potential VD. As shown in FIG. 47, fluctuation of the curve is large with respect to change of the potential VD in a linear region. In a saturated region, on the other hand, fluctuation of the curve is small with respect to change of the potential VD. The curves are substantially identical to each other particularly in the range of the potential VD of −3 V to −6 V with reference to the source electrode S. According to the embodiment 17 of the present invention, the aforementioned deviation or fluctuation of the potential at the pad 2 is absorbed by adjusting the potential VD. For example, the potential VD is set at a level lower than 0 V while the remaining potentials are set at levels similar to those in the embodiment 15 as shown in FIG. 48, for observing the drain current ID. As shown in FIG. 49, the potential of the drain electrode D is −5 V with reference to the source electrode S. Following absorption of the aforementioned deviation or potential fluctuation at the pad 2, therefore, the potential VD fluctuates in the range of −3 V to −6 V identically to the case where the same is at a constant level of −5 V.

The embodiment 17 of the present invention attains the following effects: Small change of the potential of the storage node electrode SN can be stably evaluated by setting the potential VD at a level below 0 V, regardless of the aforementioned deviation or potential fluctuation at the pad 2. Particularly in the saturated region, stable evaluation can be performed as compared with the linear region since fluctuation of the curve is small with respect to change of the potential VD.

Embodiment 18

Figure 50:
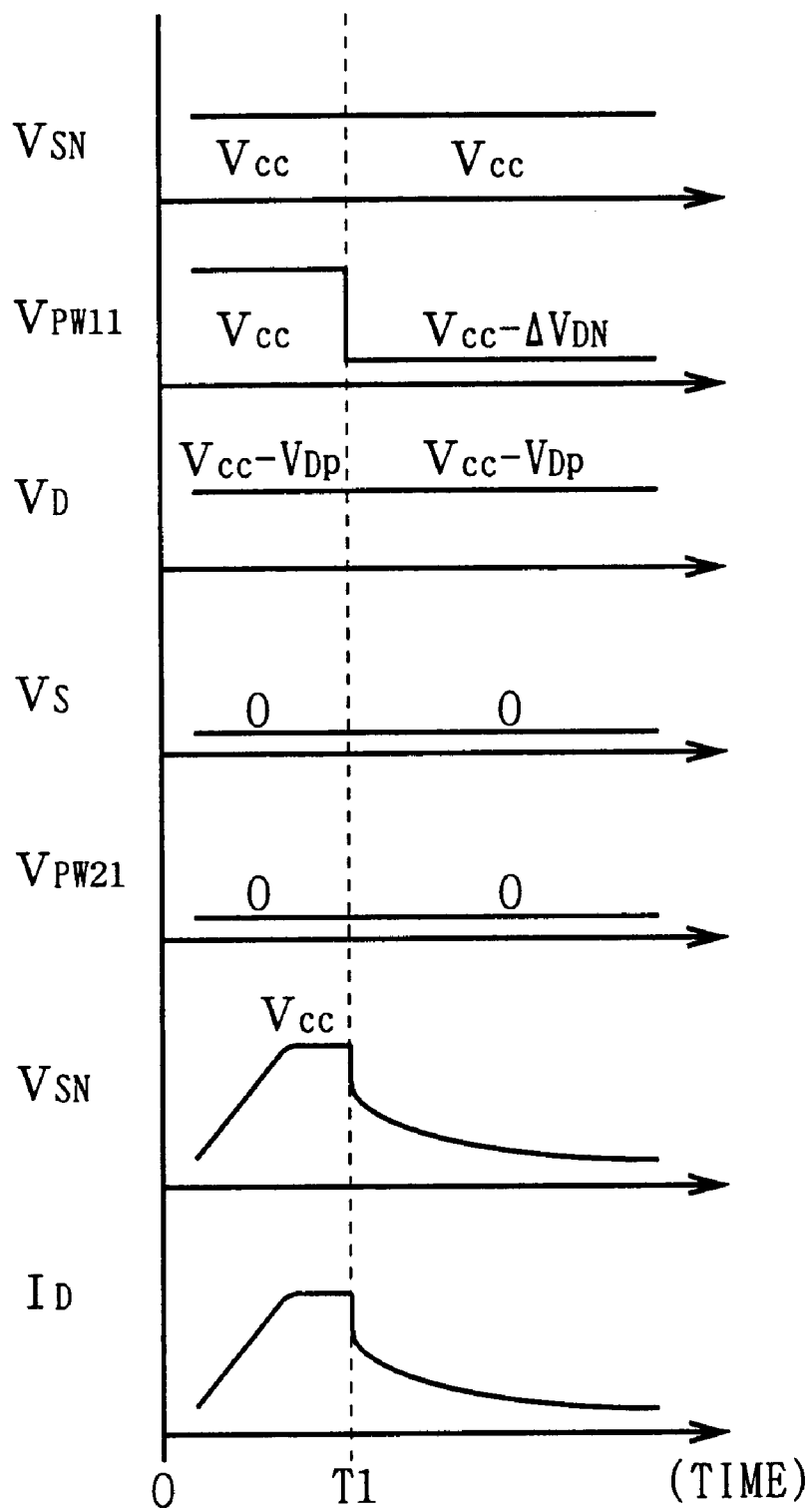
FIG. 50 is a timing chart for illustrating a memory cell evaluation method according to an embodiment 18 of the present invention.
Figure 51:
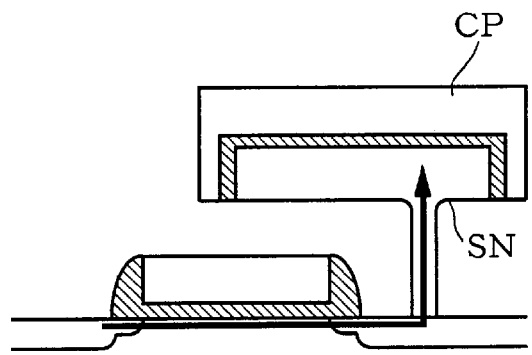
FIG. 51 is adapted to illustrate an operation of a memory cell included in a DRAM.
Figure 52:
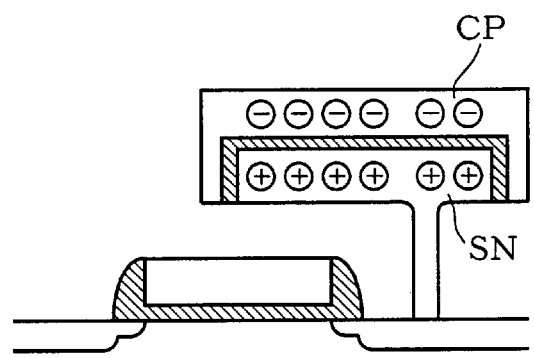
FIG. 52 is adapted to illustrate the operation of the memory cell included in the DRAM.
Figure 53:
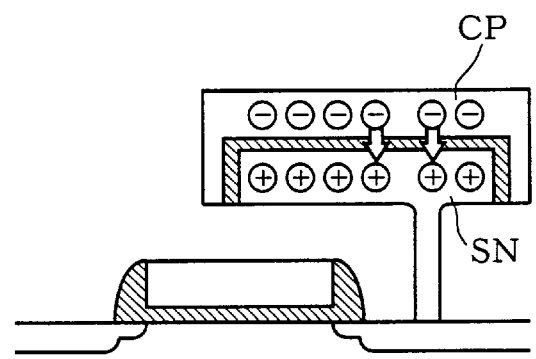
FIG. 53 is adapted to illustrate the operation of the memory cell included in the DRAM.
Figure 54:
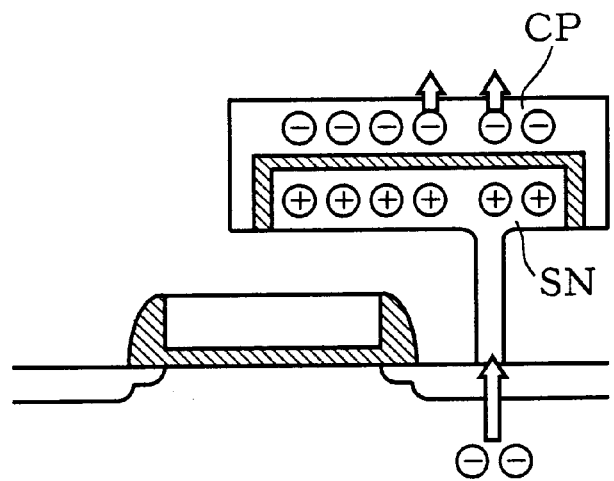
FIG. 54 is adapted to illustrate the operation of the memory cell included in the DRAM.
Figure 55:
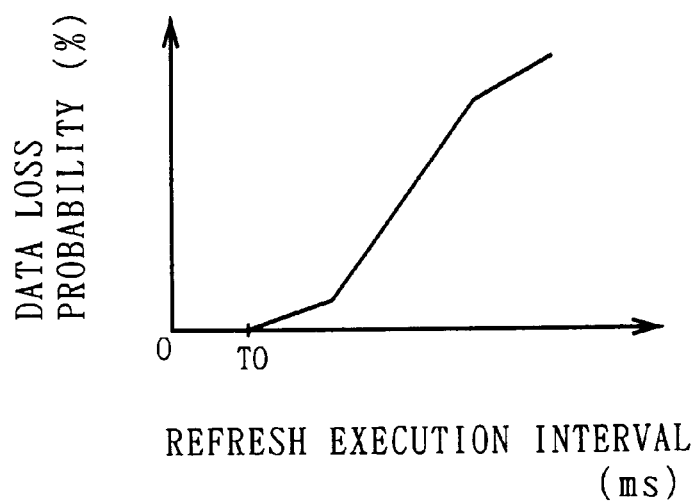
FIG. 55 is a graph statistically showing the relation between data loss and a refresh execution interval.
Figure 56:
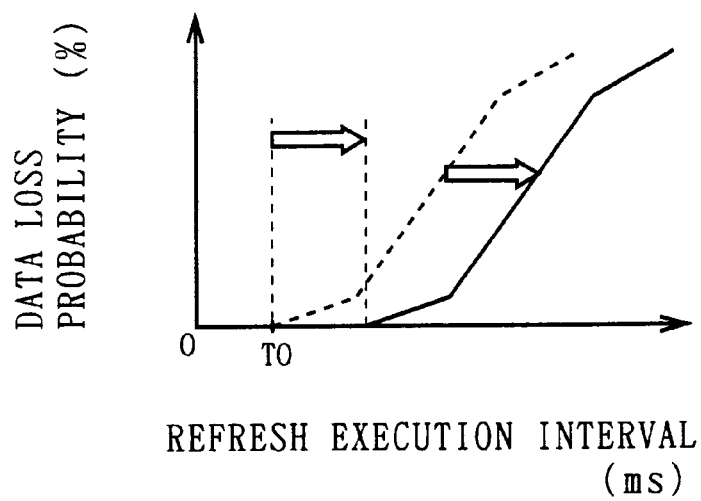
FIG. 56 is a graph for illustrating a method of extending the refresh execution interval.
Figure 57:
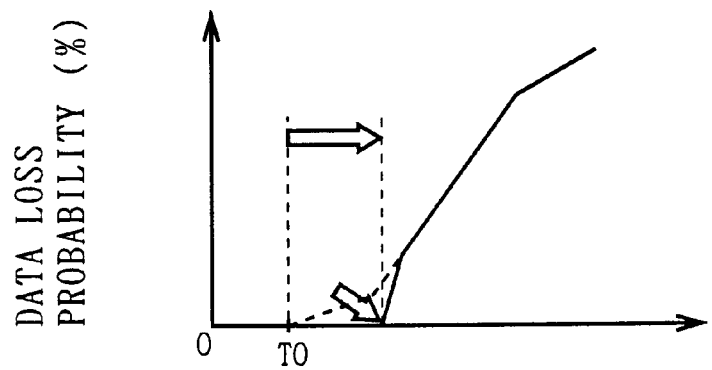
FIG. 57 is a graph for illustrating the method of extending the refresh execution interval.
Figure 58:
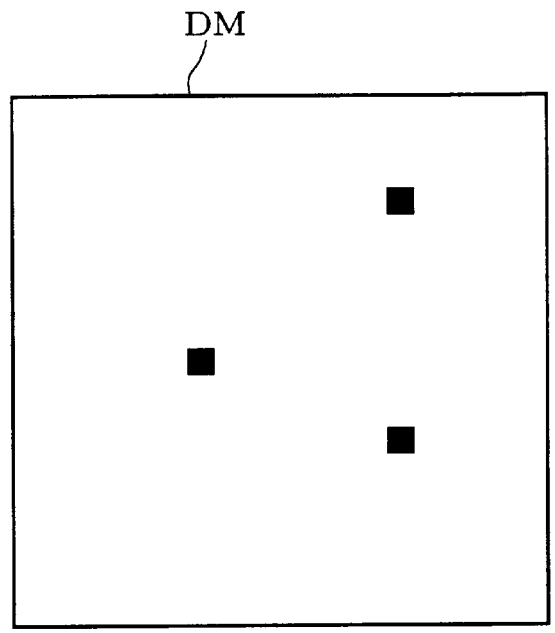
FIG. 58 is a graph for illustrating the method of extending the refresh execution interval.
Figure 59:
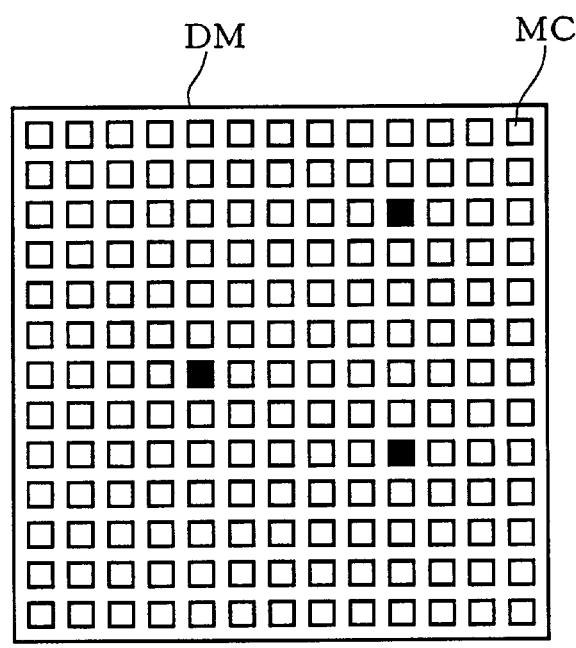
FIG. 59 is a graph for illustrating another method of extending the refresh execution interval.
Figure 60:
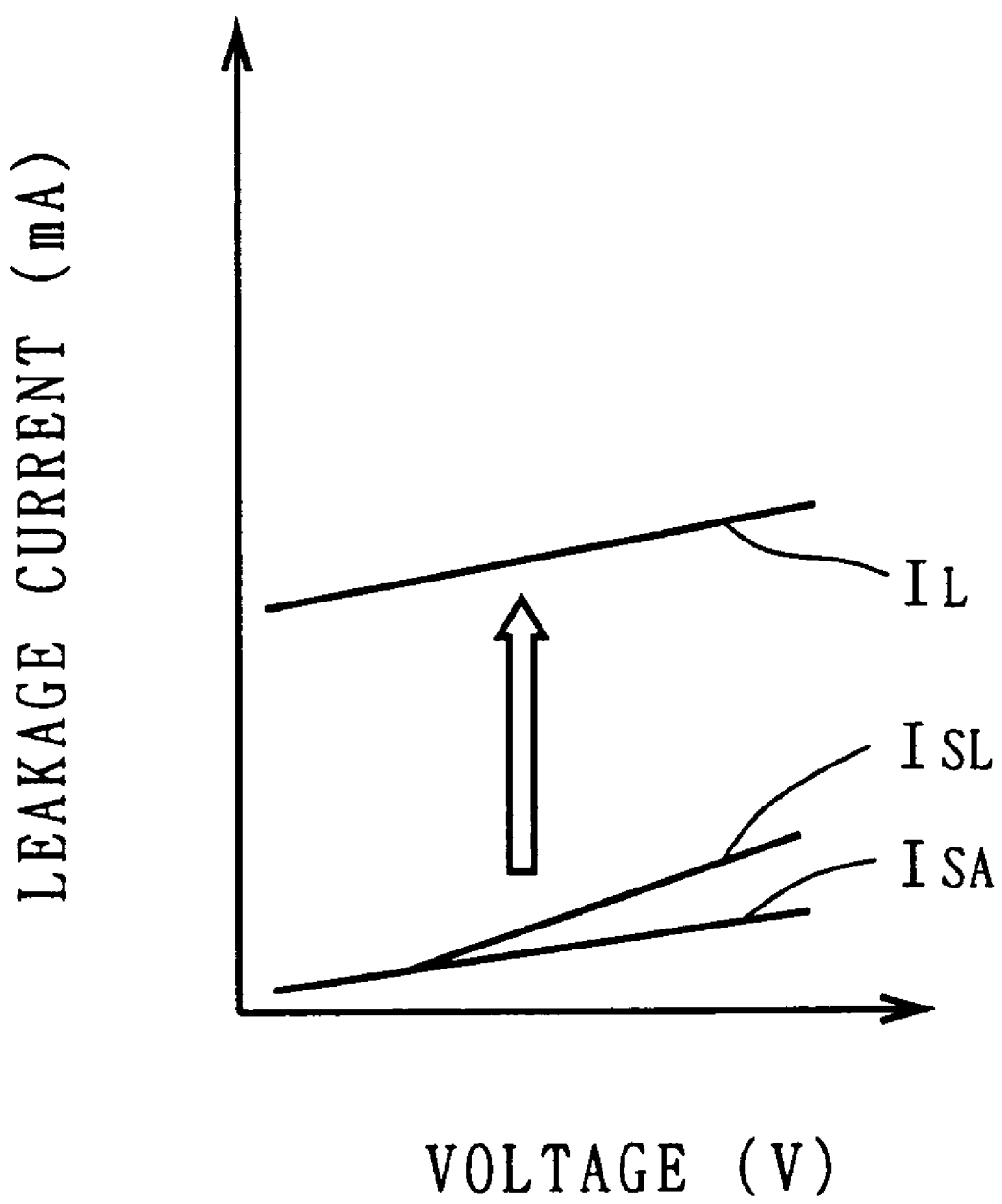
FIG. 60 is a graph for illustrating the method of extending the refresh execution interval.

A memory cell evaluation method according to an embodiment 18 of the present invention with the memory cell evaluation semiconductor device shown in FIG. 5 is now described. The embodiment 18 of the present invention is substantially similar to the embodiment 15, except a timing chart. FIG. 50 is a timing chart showing signals in the respective parts of the memory cell evaluation semiconductor device shown in FIG. 5. Referring to FIG. 50, symbols VCP, VPW11, VD, VS and VPW21 denote potentials which are supplied to the pads 2 connected with the first ends of the capacitor 311 and the P-N junction element 312 respectively, and the drain electrode, the source electrode and the back-gate electrode of the MOS transistor PT respectively, symbol VSN denotes the potential at the storage node electrode SN, and symbol ID denotes a drain current flowing out from the pad 2 which is connected with the drain electrode of the MOS transistor PT.

At a time 0 in FIG. 50, the potentials VCP and VPW11 are at a power supply potential VCC, the potentials VS and VPW21 are 0 V, and the potential VD is higher than 0 V and lower than the power supply potential VCC. The potential VPW11 is reduced at a time T1.

The embodiment 18 of the present invention attains an effect similar to that of the embodiment 15.

While the invention has been shown and described in detail, the following description is in all aspects illustrative and restrictive. It is therefore understood that numerous modifications and variations can be devised without departing from the scope of the invention.

We claim:

1. A memory cell evaluation semiconductor device comprising:
   a semiconductor substrate;
   a plurality of pads being formed on said semiconductor substrate; and
   at least one memory cell evaluation part, being formed on said semiconductor substrate, including a dummy cell part being provided with a capacitor having a first end connected to one of said plurality of pads and a P-N junction element having a first end connected to a second end of said capacitor and a second end connected to one of said plurality of pads and a sense part being connected to said second end of said capacitor for sensing the potential of said capacitor and outputting the result of sensing to one of said plurality of pads.

2. The memory cell evaluation semiconductor device in accordance with claim 1, wherein said sense part comprises a MOS transistor including:
a gate electrode being connected to said second end of said capacitor,
a source electrode being connected to one of said plurality of pads,
a drain electrode being connected to one of said plurality of pads, and
a back-gate electrode being connected to one of said plurality of pads.

3. The memory cell evaluation semiconductor device in accordance with claim 2, wherein
said MOS transistor is of a p type, and
said pad being connected with said source electrode is identical to that connected with said first end of said capacitor.

4. The memory cell evaluation semiconductor device in accordance with claim 2, wherein
said MOS transistor is of a p type, and
said pad being connected with said source electrode, that connected with said first end of said capacitor and that connected with said back-gate electrode are identical to each other.

5. The memory cell evaluation semiconductor device in accordance with claim 2, wherein
said pad being connected with said source electrode is identical to that connected with said back-gate electrode.

6. The memory cell evaluation semiconductor device in accordance with claim 2, wherein
said MOS transistor is of an n type.

7. The memory cell evaluation semiconductor device in accordance with claim 6, wherein
said pad being connected with said drain electrode is identical to that connected with said first end of said capacitor.

8. The memory cell evaluation semiconductor device in accordance with claim 1, comprising a plurality of said memory cell evaluation parts,
sense parts included in said plurality of memory cell evaluation parts supplying the results of sensing to the same said pad.

9. The memory cell evaluation semiconductor device in accordance with claim 8, further comprising a decoder being connected to some of said plurality of pads for driving said memory cell evaluation parts corresponding to address signals being applied to said pads.

10. The memory cell evaluation semiconductor device in accordance with claim 1, further comprising:
a dummy cell part forming region being provided on said semiconductor substrate for forming said dummy cell part, and
a sense part forming region being provided on said semiconductor substrate for forming said sense part,
said dummy cell part forming region and said sense part forming region being electrically isolated from each other.

11. The memory cell evaluation semiconductor device in accordance with claim 10, wherein
said dummy cell part forming region and said sense part forming region are in well structures of the same polarity,
said memory cell evaluation semiconductor device further comprising a well region being formed between said dummy cell part forming region and said sense part forming region.

12. The memory cell evaluation semiconductor device in accordance with claim 1, further comprising:
a dummy cell part forming region being provided on said semiconductor substrate for forming said dummy cell part,
a sense part forming region being provided on said semiconductor substrate for forming said sense part, and
a bottom layer being formed under said dummy cell part forming region and said sense part forming region.

13. A memory cell evaluation method employing a memory cell evaluation semiconductor device comprising:
a semiconductor substrate;
a plurality of pads being formed on said semiconductor substrate; and
at least one memory cell evaluation part, being formed on said semiconductor substrate, including a dummy cell part being provided with a capacitor having a first end connected to one of said plurality of pads and a P-N junction element having a first end connected to a second end of said capacitor and a second end connected to one of said plurality of pads and a sense being connected to said second end of said capacitor for sensing the potential of said capacitor and outputting the result of sensing to one of said plurality of pads,
said sense part comprising a MOS transistor including:
a gate electrode being connected to said second end of said capacitor,
a source electrode being connected to one of said plurality of pads, and
a drain electrode being connected to one of said plurality of pads,
said memory cell evaluation method comprising:
(a) a step of applying a forward potential of said P-N junction element to said pad being connected to said second end of said P-N junction element;
(b) a step of detecting a drain current flowing between said pad being connected with said drain electrode and said pad being connected with said source electrode; and
(c) a step of obtaining a gate voltage of said MOS transistor by comparing a gate voltage-to-drain current characteristic of said MOS transistor and said drain current being detected in said step (b).

14. The memory cell evaluation method in accordance with claim 13, wherein
said step (a) comprises:
(a-1) a step of detecting that said drain current flowing between said pad being connected with said drain electrode and said pad being connected with said source electrode becomes zero, and
(a-2) a step of applying a reverse voltage of said P-N junction element to said pad being connected with said second end of said P-N junction element when detecting that said drain current becomes zero in said step (a-1).

15. The memory cell evaluation method in accordance with claim 13, further comprising:
(d) a step of supplying a potential of not more than 0 V to said pad being connected with said drain electrode.

16. The memory cell evaluation method in accordance with claim 13, wherein
said step (c) comprises:
(c-1) a step of obtaining said gate voltage through a saturated region in said gate voltage-to-drain current characteristic of said MOS transistor.

17. The memory cell evaluation method in accordance with claim 13, wherein
a back-gate electrode of said MOS transistor is connected to one of said plurality of pads,
said memory cell evaluation method further comprising:
(d) a step of supplying a potential for shifting said saturated region to said pad being connected with said back-gate electrode.

18. The memory cell evaluation method in accordance with claim 17, wherein
said potential supplied to said pad being connected with said back-gate electrode in said step (d) is higher than that supplied to said pad being connected with said source electrode.

* * * * *